(12) United States Patent
Zeng et al.

(10) Patent No.: US 10,185,861 B2
(45) Date of Patent: Jan. 22, 2019

(54) DISPLAY PANEL AND ELECTRONIC DEVICE

(71) Applicant: SHANGHAI TIANMA MICRO-ELECTRONICS CO., LTD., Shanghai (CN)

(72) Inventors: Yang Zeng, Shanghai (CN); Qing Zhang, Shanghai (CN); Lihua Wang, Shanghai (CN); Liang Xie, Shanghai (CN); Lingxiao Du, Shanghai (CN); Hong Ding, Shanghai (CN); Huiping Chai, Shanghai (CN); Kang Yang, Shanghai (CN); Qijun Yao, Shanghai (CN)

(73) Assignee: SHANGHAI TIANMA MICRO-ELECTRONICS CO., LTD., Shanghai (CN)

( * ) Notice: Subject to any disclaimer, the term of this patent is extended or adjusted under 35 U.S.C. 154(b) by 0 days.

(21) Appl. No.: 15/796,484

(22) Filed: Oct. 27, 2017

(65) Prior Publication Data
US 2018/0129852 A1    May 10, 2018

(30) Foreign Application Priority Data

Apr. 27, 2017   (CN) .......................... 2017 1 0289213

(51) Int. Cl.
| | | |
|---|---|---|
| G06F 3/041 | (2006.01) | |
| G06K 9/00 | (2006.01) | |
| H01L 27/32 | (2006.01) | |
| H01L 51/52 | (2006.01) | |

(52) U.S. Cl.
CPC ...... *G06K 9/00013* (2013.01); *H01L 27/3216* (2013.01); *H01L 27/3234* (2013.01); *H01L 27/3253* (2013.01); *H01L 27/3265* (2013.01); *H01L 27/3276* (2013.01); *H01L 51/5218* (2013.01); *H01L 27/323* (2013.01); *H01L 27/3211* (2013.01); *H01L 2251/5315* (2013.01)

(58) Field of Classification Search
CPC .... G06F 1/1626; G06F 1/1684; G06F 1/1696; G06F 21/32
USPC .................. 345/173, 174; 382/115, 124–127
See application file for complete search history.

(56) References Cited

FOREIGN PATENT DOCUMENTS

CN      106298859 A     1/2017

*Primary Examiner* — Calvin C Ma
(74) *Attorney, Agent, or Firm* — Alston & Bird LLP

(57) ABSTRACT

A display panel and an electronic device are provided. The display panel includes: an array substrate; a plurality of organic light emitting units disposed on the array substrate; at least one fingerprint identification unit located in a display region at a side close to the array substrate of the organic light emitting units. The fingerprint identification unit performs fingerprint identification according to light rays reflected on the fingerprint identification unit by a touch body. Each organic light emitting unit includes a red organic light emitting unit, a green organic light emitting unit and a blue organic light emitting unit. In a fingerprint identification phase, the red/green organic light emitting unit emits light to be a light source for the fingerprint identification unit. Compared with the blue organic light emitting unit, the red/green organic light emitting unit has a smaller transparent area towards a side opposite to a display side.

20 Claims, 33 Drawing Sheets

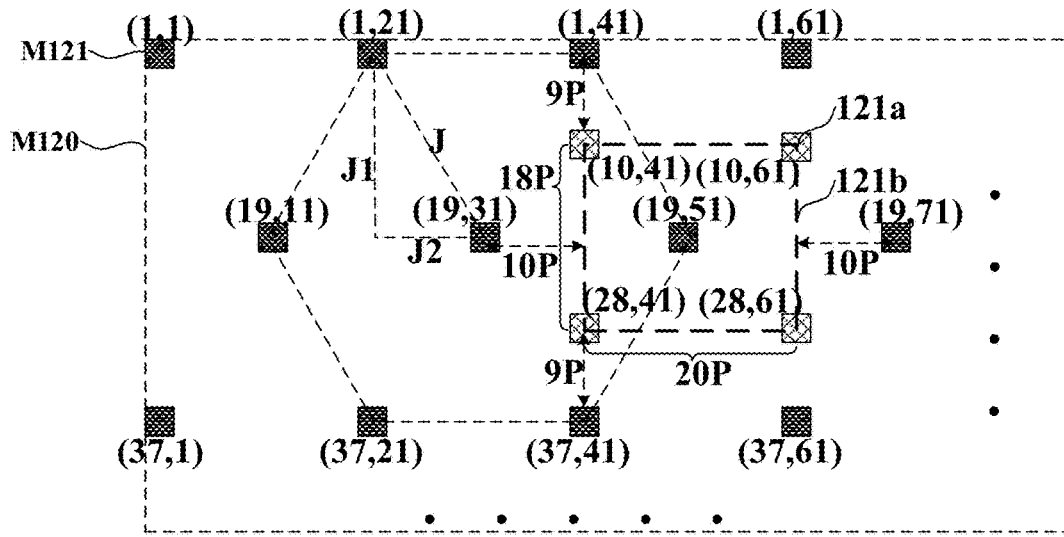

FIG. 23b

```
In a fingerprint identification phase, control each organic light emitting     M310
unit in the organic light emitting layer to emit light according to
the first light emitting lattice and shift
                                    ↓
Perform the fingerprint identification by the fingerprint identification       M320
array according to the light ray reflected on each of the fingerprint
identification units through a touch body on the first surface of the
cover plate
```

FIG. 24

DISPLAY PANEL AND ELECTRONIC DEVICE

CROSS-REFERENCE TO RELATED APPLICATIONS

This application claims priority to a Chinese patent application No. CN201710289213.4 filed on Apr. 27, 2017, the disclosure of which is incorporated herein by reference in its entirety.

TECHNICAL FIELD

The present disclosure relates to the technical field of display, and particularly relates to a display panel and an electronic device.

BACKGROUND

Fingerprints are inherent and unique for everyone. With the development of display technologies, various display apparatuses having a fingerprint identification function, and electronic devices including display apparatuses, such as a mobile phone, a tablet personal computer, a smart wearable device, etc., appear on market. In these devices, when a user operates a display apparatus with the fingerprint identification function, the user only needs to touch a fingerprint identification module of the display apparatus with one finger to perform authority verification, thereby simplifying an authority verification process.

In an existing display apparatus having a fingerprint identification function, a fingerprint identification module is generally arranged in a non-display region of a display panel, or arranged on a surface opposite to the light exiting side of the display apparatus. To perform the authority verification on a display panel's fingerprint identification module, a user needs to record this fingerprint on the module, thereby reducing user interest in doing it. In addition, since the fingerprint identification module is arranged in the non-display region of the display panel, a screen-to-body ratio is reduced, which is against the development trend of edge narrowing in the display panel. When an organic light emitting unit in the display panel is used as a light source of the fingerprint identification module, a part of light rays emitted from the organic light emitting unit are directly irradiated on a fingerprint identification unit in the fingerprint identification module instead of being reflected through a touch body (such as a finger), thereby forming noise and degrading a fingerprint identification's precision.

SUMMARY

The present disclosure provides a display panel and an electronic device, so as to reduce an intensity of light rays directly irradiated on the fingerprint identification unit without being reflected through a touch body and improve the fingerprint identification precision.

In a first aspect, embodiments of the present disclosure provide a display panel, including: an array substrate; a plurality of organic light emitting units disposed on the array substrate; and at least one fingerprint identification unit located in a display region at a side, close to the array substrate, of the plurality of organic light emitting unit. The at least one fingerprint identification unit is configured to perform fingerprint identification according to light rays reflected on the at least one fingerprint identification unit by a touch body. The plurality of organic light emitting units each include a red organic light emitting unit, a green organic light emitting unit and a blue organic light emitting unit. At least one of the red organic light emitting unit and the green organic light emitting unit emits light in a fingerprint identification phase, and serves as a light source for the fingerprint identification unit. Compared with the blue organic light emitting unit, at least one of the red organic light emitting unit and the green organic light emitting unit serving as the light source for the fingerprint identification unit has a smaller transparent area towards a side opposite to a display side of the display panel.

In a second aspect, embodiments of the present disclosure further provide a display apparatus, including the display panel described in the first aspect.

The display panel provided in the present disclosure includes a plurality of organic light emitting units disposed on the array substrate, and at least one fingerprint identification unit. Each organic light emitting unit includes a red organic light emitting unit, a green organic light emitting unit and a blue organic light emitting unit. In a light emitting display phase, the red organic light emitting unit, the green organic light emitting unit and the blue organic light emitting unit emit light according to preset modes. In a fingerprint identification phase, since the light rays emitted from the blue organic light emitting unit are easy to be absorbed by the display panel, the red organic light emitting unit and/or the green organic light emitting unit emit light and serve as the light source for the fingerprint identification unit. Compared with the blue organic light emitting unit, the red organic light emitting unit and/or the green organic light emitting unit serving as the light source for the fingerprint identification unit has a smaller area towards a side opposite to the display side of the display panel. Therefore, stray light directly irradiated on the fingerprint identification unit without being reflected through the touch body (such as a finger) is reduced, fingerprint detection noise is reduced and the fingerprint identification precision is improved.

BRIEF DESCRIPTION OF DRAWINGS

FIG. 1b is a schematic diagram of a zoom-in top view illustrating the S1 region in FIG. 1a;

FIG. 1c is a schematic diagram of a cross section along line AA' in FIG. 1a;

FIG. 10b is a schematic diagram of a cross section along line BB' in FIG. 10a;

FIG. 11b is a schematic diagram of a cross section along line CC' in FIG. 11a;

FIG. 11d is a diagram illustrating the geometrical relationship for a diffusion distance of an angle-limiting film shown in FIG. 11a;

FIG. 12b is a schematic diagram of a cross section along line DD' in FIG. 12a;

FIG. 13b is a schematic diagram of a cross section along an extension direction of optical fiber structures in FIG. 13a;

FIG. 13c is a geometrical relationship diagram illustrating a diffusion distance of an angle-limiting film shown in FIG. 13a;

FIG. 14b is a schematic diagram of a cross section along line EE' in FIG. 14a;

FIG. 15b is a zoom-in top view illustrating a display apparatus shown in FIG. 15a;

FIG. 15c is a schematic diagram illustrating scanning of a fingerprint identification phase of a display apparatus shown in FIG. 15a;

FIG. 15d is a specific structural schematic diagram of FIG. 15a;

FIG. 18b is a cross sectional view along line FF' in FIG. 18a;

FIG. 19b is a cross sectional view along line GG' in FIG. 19a;

FIG. 23b is a schematic diagram illustrating a scanning mode of a hexagonal array of a display apparatus provided by embodiments of the present disclosure;

FIG. 24 is a flow chart illustrating a method to identify fingerprint on a display apparatus provided in another embodiment of the present disclosure.

DETAILED DESCRIPTION

The present disclosure is further described below in detail in combination with drawings and embodiments. It can be understood that specific embodiments described herein are only used for explaining the present disclosure, not limiting the present disclosure. It should also be noted that to facilitate description, drawings only show some structures relevant to the present disclosure, not all of the structures.

Figure 1A:
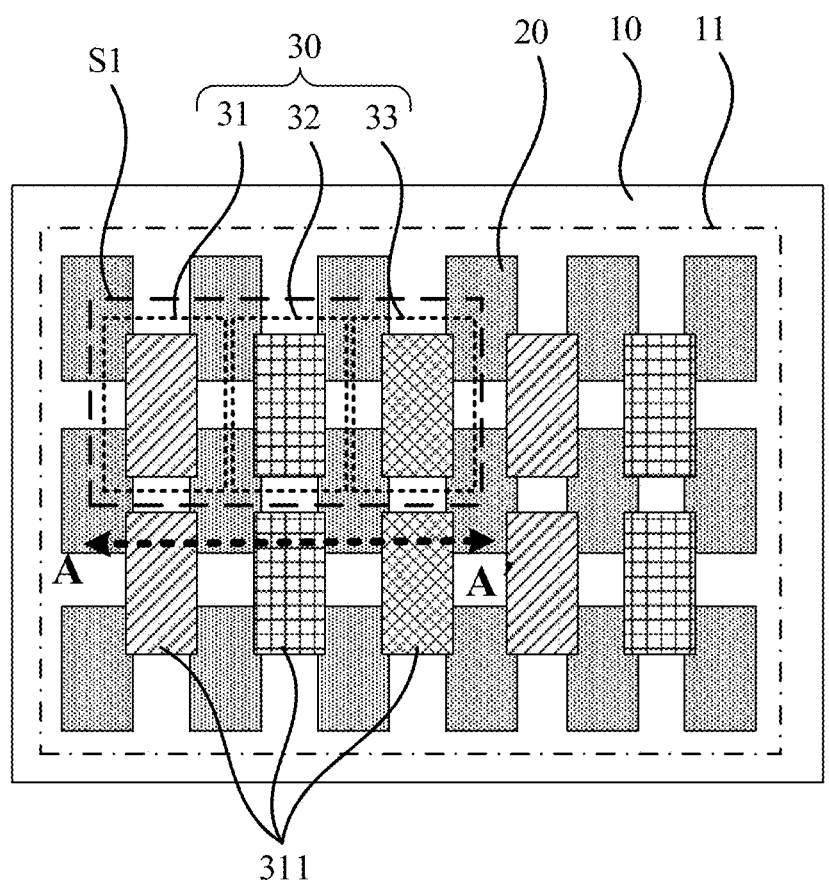
FIG. 1a is a schematic diagram of a top view illustrating a display panel in accordance with embodiments of the present disclosure.
Figure 1B:
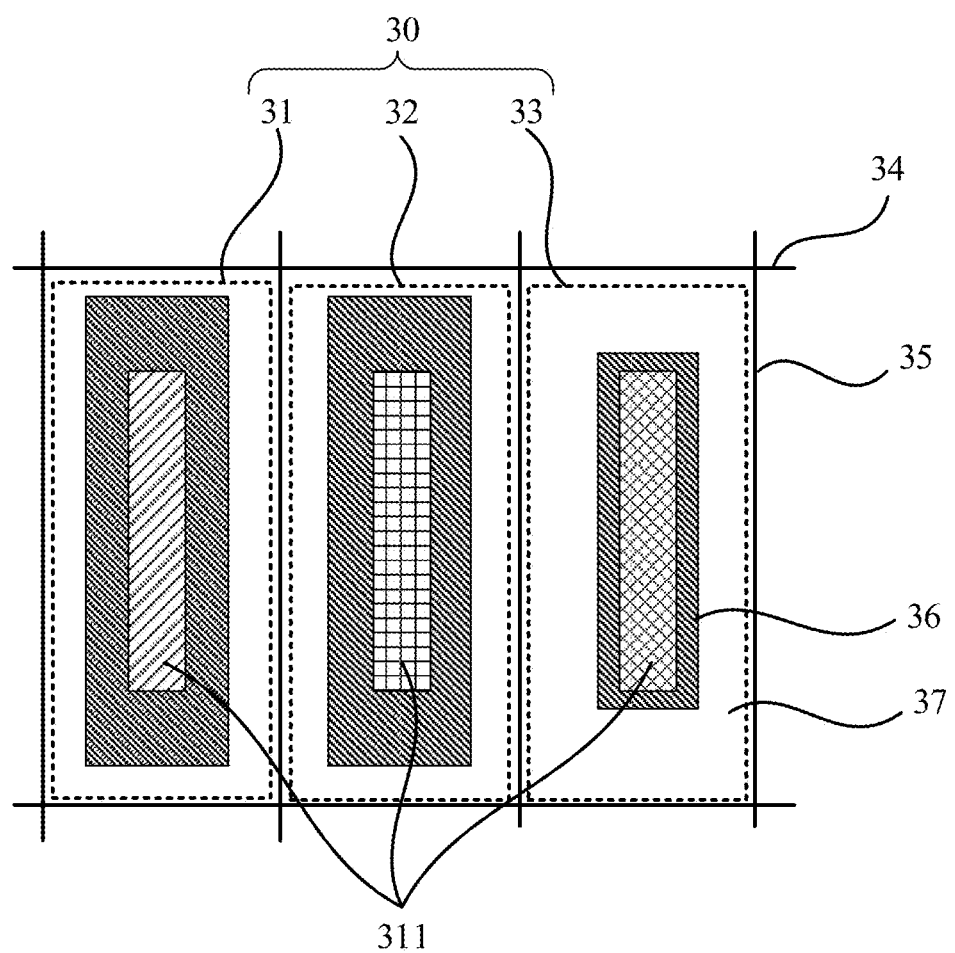
Figure 1C:
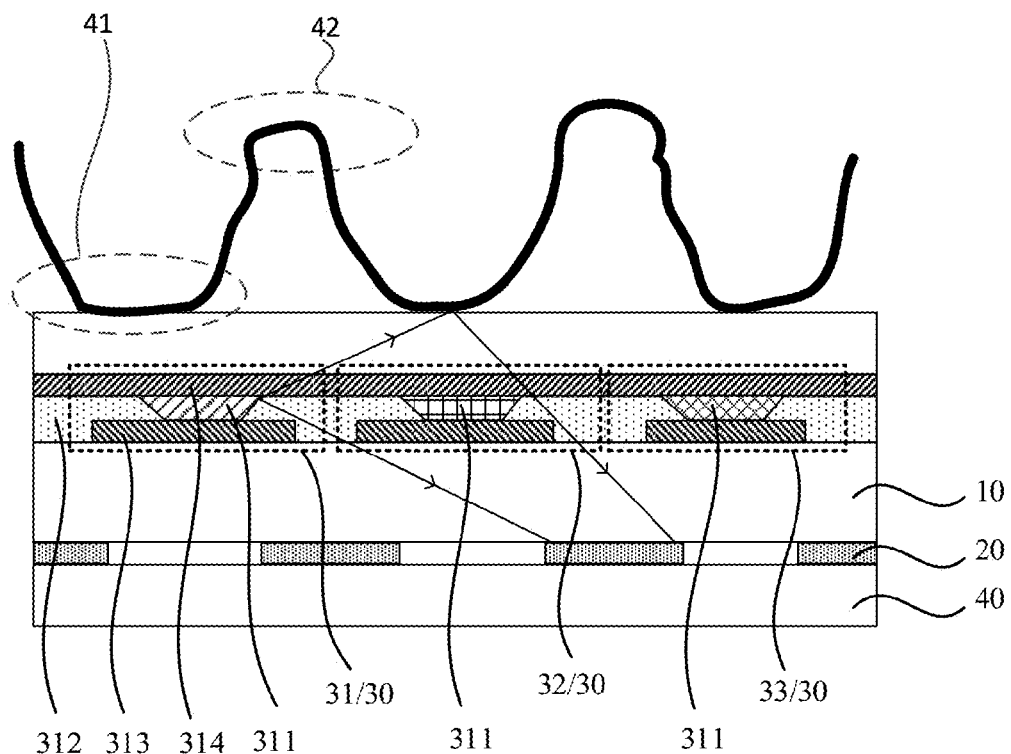

FIG. 1a is a top structural schematic diagram illustrating a display panel provided by embodiments of the present disclosure. FIG. 1b is a zoom-in top view illustrating S1 region in FIG. 1a. FIG. 1c is a schematic diagram of a cross section along line AA' in FIG. 1a. With reference to FIG. 1a, FIG. 1b and FIG. 1c, the display panel provided in embodiments of the present disclosure includes an array substrate 10, a plurality of organic light emitting units 30 and at least one fingerprint identification unit 20. The plurality of organic light emitting units 30 are arranged on the array substrate 10. The fingerprint identification unit 20 is located in a display region 11 at one side close to the array substrate 10 of the organic light emitting units 30. The fingerprint identification unit 20 is configured to perform fingerprint identification according to light rays reflected, through a touch body (such as a finger), on the fingerprint identification unit 20. Each organic light emitting unit 30 includes a red organic light emitting unit 31, a green organic light emitting unit 32 and a blue organic light emitting unit 33. In a fingerprint identification phase, the red organic light emitting unit 31 and/or the green organic light emitting unit 32 are configured to emit light and are serving as the light source for the fingerprint identification unit 20. Compared with the blue organic light emitting unit 33, the red organic light emitting unit 31 and/or the green organic light emitting unit 32 as the light source for the fingerprint identification unit 20 has a smaller transparent area at a side opposite to the display side of the display panel. It should be noted that the number of the organic light emitting units and the arrangement of the red organic light emitting unit, the green organic light emitting unit and the blue organic light emitting unit in the organic light emitting units are not limited by embodiments of the present disclosure.

Exemplarily, with reference to FIG. 1b and FIG. 1c, each organic light emitting unit 30 includes a first electrode 313, a light emitting functional layer 311 and a second electrode 314 sequentially along a direction from the array substrate 10 to the organic light emitting unit 30. Each organic light emitting unit 30 includes a red organic light emitting unit 31, a green organic light emitting unit 32 and a blue organic light emitting unit 33. Each organic light emitting unit 30 includes a light emitting functional layer 311. The light emitting functional layer 311 has a transparent region 37 and an opaque region 36 in a direction facing away from the display side of the display panel. For a top emitting type display panel, the display side of the display panel means a direction in which the organic light emitting unit 30 faces away from the array substrate 10. The light emitting functional layer 311 includes a first auxiliary functional layer, a light emitting material layer and a second auxiliary functional layer. The first auxiliary functional layer is a hole type auxiliary functional layer, and may have a multilayer structure, e.g., including one or more of a hole injection layer, a hole transportation layer and an electron blocking layer. The second auxiliary functional layer is an electronic type auxiliary functional layer and may have a multilayer structure, e.g., including one or more of an electron transportation layer, an electron injection layer, and a hole blocking layer. When being applied an external electric field, electrons and holes are injected into the light emitting material layer in the light emitting functional layer 311 from the second electrode 314 and the first electrode 313 respectively and are recombined to generate an exciton. The exciton is driven by the external electric field to migrate, energy is transferred to light emitting molecule in the light emitting material layer and the electrons are excited to jump from a ground state to an excitation state. The excited state energy is released in a radiative jump manner, and thus the light rays are generated. In the present embodiment, the first electrode 313 is configured as an anode, and the second electrode 314 is configured as a cathode. In other embodiments, the first electrode 313 can also be set as the cathode and the second electrode 314 is the anode. Embodiments of the present disclosure do not limit this.

With reference to FIG. 1c, the touch body is irradiated by light rays emitted from light sources. The touch body is generally a finger. The fingerprint is composed of a series of ridges 41 and valleys 42 on a skin surface of a fingertip. Since intensities of light rays, which are received by the fingerprint identification unit, reflected by the ridges 41 and the valleys 42 are different, a current signal converted by the reflection light formed at the ridges 41 and a current signal converted by the reflection light formed at the valleys 42 are different in magnitudes. Then, fingerprint identification can be performed according to the magnitudes of the current signals. It should be noted that the touch body may also be a palm and the like, and a palm print can also be used to realize detection and identification functions.

The display panel provided in embodiments of the present disclosure includes a plurality of organic light emitting units arranged on the array substrate, and at least one fingerprint identification unit. Each organic light emitting unit includes the red organic light emitting unit, the green organic light emitting unit and the blue organic light emitting unit. In a light emitting display phase, the red organic light emitting unit, the green organic light emitting unit and the blue organic light emitting unit are configured to emit light according to a preset mode. In a fingerprint identification phase, the red organic light emitting unit and/or the green organic light emitting unit are configured to emit light and serve as light sources of the fingerprint identification unit because the light rays emitted from the blue organic light emitting unit have a lower transmittance. This is because that the light rays emitted from the blue organic light emitting unit have a shorter wavelength while various film (an organic insulation layer, an inorganic insulation layer, a polarizer and the like) in the display panel has a stronger absorption effect on the light rays with the shorter wavelength. Moreover, compared with the blue organic light emitting unit, the red organic light emitting unit and/or the green organic light emitting unit as the light source for the fingerprint identification unit is set to have a smaller transparent area towards a side opposite to the display side of the display panel. Since the organic light emitting units as the light sources have a smaller transparent area, stray light directly irradiated on the fingerprint identification unit without being reflected through the touch body (such as the finger) is reduced. Only light rays reflected through the touch body is carried with the fingerprint information, while the light rays (stray light) directly irradiated on the fingerprint identification unit without being reflected through the touch body are not carried with the fingerprint information. Therefore, in embodiments of the present disclosure, noise in fingerprint detection is reduced by reducing the stray light, and the fingerprint identification precision is improved.

Optionally, with reference to FIG. 1c, the display panel further includes a first substrate 40. The first substrate 40 is arranged at one side, facing away from the organic light emitting units 30, of the array substrate 10. The fingerprint identification unit 20 is arranged between the array substrate 10 and the first substrate 40. The fingerprint identification unit 20 and the first substrate 40 may be used as a part of the fingerprint identification module. The fingerprint identification module may further include some metal connection wires and an IC driving circuit (not shown in the drawings).

Optionally, with reference to FIG. 1b and FIG. 1c, each organic light emitting unit 30 includes the first electrode 313, the light emitting functional layer 311 and the second electrode 314 sequentially along a direction in which the organic light emitting unit 30 faces away from the array substrate 10. The first electrode 313 is a reflective electrode. For example, the reflective electrode is configured to include an indium tin oxide conductive film, a reflective electrode layer (Ag) and another indium tin oxide conductive film sequentially arranged. The indium tin oxide conductive film is a high-work-function material and is beneficial to hole injection. The light emitting functional layer 311 of the red organic light emitting unit 31, the light emitting functional layer 311 of the green organic light emitting unit 32 and the light emitting functional layer 311 of the blue organic light emitting unit 33 are further spaced by a pixel definition layer 312. As shown in FIG. 1b and FIG. 1c, both the red organic light emitting unit 31 and the green organic light emitting unit 32 exemplarily serve as the light sources for fingerprint identification in embodiments of the present disclosure. The area of the first electrode 313 of the red organic light emitting unit 31 and the green organic light emitting unit 32 is greater than the area of the first electrode 313 of the blue organic light emitting unit 33. The light rays emitted from the light emitting functional layer 311 in the organic light emitting unit 30 to the side of the array substrate 10 are blocked by the first electrode 313 arranged between the light emitting functional layer 311 and the fingerprint identification unit 20. Moreover, the reflective electrodes of the red organic light emitting unit 31 and the green organic light emitting unit 32 as the light sources of the fingerprint identification unit 20 are extended relative to the existing art. Therefore, the stray light to be irradiated on the fingerprint identification unit 20 is blocked, and the fingerprint identification precision is improved. In other words, the area of the reflective electrode in the blue organic light emitting unit 33 is configured to be unchanged, and the areas of the reflective electrodes in the red organic light emitting unit 31 and the green organic light emitting unit 32 are increased based on the existing art, so as to block the stray light. In addition, the reflective electrode is adjacent to or in contact with the light emitting functional layer, and the light rays emitted from the light emitting functional layer to the side of the array substrate are close to an edge of the reflective electrode. Therefore, the reflective electrode can be configured to extend by a certain distance to block the light rays emitted from the light emitting functional layer from being directly irradiated on the fingerprint identification unit. Moreover, when the reflective electrode is extended to a certain degree, the stray light irradiated on the fingerprint identification unit can be completely blocked, thereby greatly improving the fingerprint identification precision.

Optionally, with reference to FIG. 1b and FIG. 1c, for the organic light emitting unit 30 serving as the light source for the fingerprint identification unit, an area ratio of the first electrode 313 to the light emitting functional layer 311 is in a range of 1.2 to 6; for the organic light emitting units 30 not serving as the light source for the fingerprint identification unit 20, the area ratio of the first electrode 313 to the light emitting functional layer 311 is in a range of 1 to 1.2. Exemplarily, with reference to FIG. 1b and FIG. 1c, the red organic light emitting unit 31 and the green organic light emitting unit 32 serve as the light sources of the fingerprint identification unit, and the opaque region 36 in FIG. 1b is a vertical projection, on the array substrate 10, of the first electrode 313 of the organic light emitting unit 30. It can be seen that, compared with the blue organic light emitting unit 33, the ratio of the area of the opaque region 36 (the area of the first electrode) to the area of the light emitting functional layer 311 is larger in the red organic light emitting unit 31 and the green organic light emitting unit 32. When the area ratio of the first electrode to the light emitting functional layer is set to be in a range of 1.2 to 6 in the organic light emitting units serving as the light sources of the fingerprint identification unit, the first electrode can effectively prevent the light rays emitted from the light emitting functional layer from being directly irradiated on the fingerprint identification unit, thereby effectively preventing the stray light, reducing noise in the fingerprint detection and improving the fingerprint identification precision. It can be understood that the larger the scope of the ratio of the area of the first electrode to the area of the light emitting functional layer in the organic light emitting units as the light sources of the fingerprint identification unit is, the more effective the blocking of the first electrode for the stray light is. When the ratio of the area of the first electrode to the area of the light emitting functional layer is 6 in the organic light emitting units as the light sources of the fingerprint identification unit, most of the stray light is exactly blocked by the first electrode, thereby greatly improving the fingerprint identification precision.

Figure 1D:
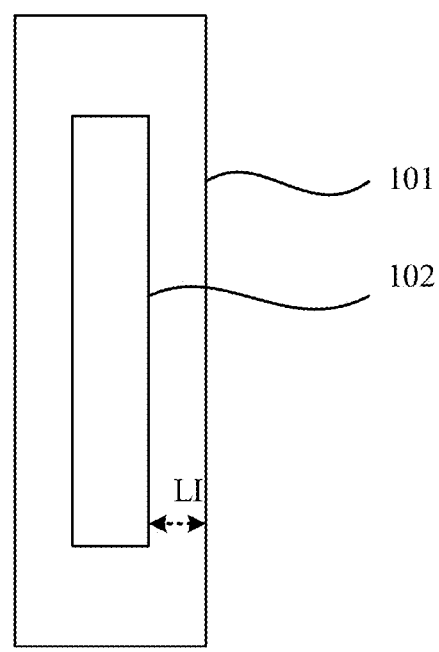
FIG. 1d is a schematic diagram illustrating a distance between a first closed coil and a second closed coil.

Optionally, with reference to FIG. 1c to FIG. 1d, as for the organic light emitting unit 30 as the light source for the fingerprint identification unit 20, the vertical projection on the array substrate 10 of the border of the first electrode 313 forms a first closed coil 101, and the vertical projection, on the array substrate 10, of the border of the light emitting functional layer 311 forms a second closed coil 102. FIG. 1d is a schematic diagram illustrating a range of the distance between the first closed coil and the second closed coil. With reference to FIG. 1d, the second closed coil 102 is encircled by the first closed coil 101. With respect to any point on the first closed coil 101, there exists a an associated point, a distance between which and the point on the first closed coil 101 is the shortest distance LI, on the second closed coil 102. The range of the distance between the first closed coil 101 and the second closed coil 102 is a set of the shortest distances LI for all points on the first closed coil 101. The distance between the first closed coil 101 and the second closed coil 102 ranges from 3 μm to 30 μm. This range of the distance between the first closed coil 101 and the second closed coil 102 represents an extension of the first electrode in its own plane in any directions. When the distance between the first closed coil 101 and the second closed coil 102 ranges from 3 μm to 30 μm, the first electrode can effectively block the stray light, and the fingerprint identification precision is improved.

Figure 1E:
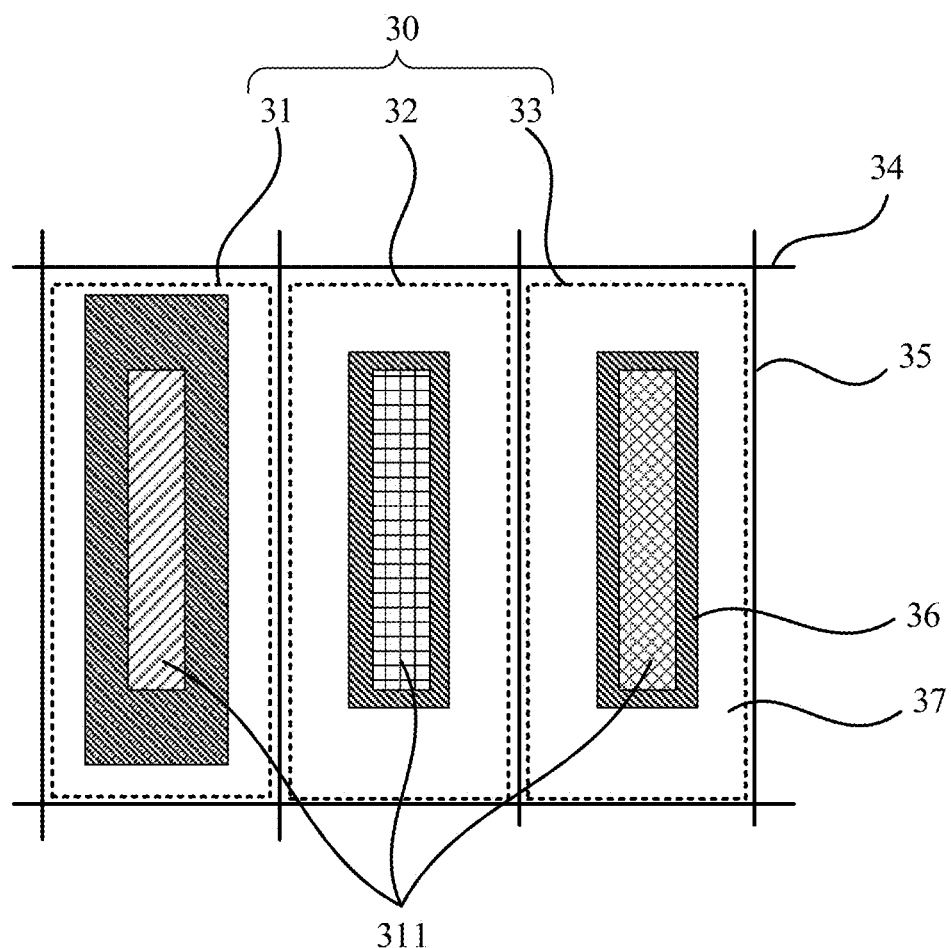
FIG. 1e is a zoom-in top view illustrating another S1 region provided by embodiments of the present disclosure.

FIG. 1e is a zoom-in top view illustrating another S1 region provided by embodiments of the present disclosure. As shown in FIG. 1e, compared with the transparent area of the blue organic light emitting unit 33 towards a side opposite to the display side of the display panel, the transparent area of the red organic light emitting unit 31 as the light source for the fingerprint identification unit towards the side opposite to the display side of the display panel is smaller; and compared with the transparent area of the green organic light emitting unit 32 towards the side opposite to the display side of the display panel, the transparent area of the red organic light emitting unit 31 as the light source for the fingerprint identification unit towards the side opposite to the display side of the display panel is smaller. Since only the red organic light emitting unit serves as the light source for fingerprint identification, it is only required to block the light rays emitted from the light emitting functional layer in the red organic light emitting unit to the side opposite to the display side of the display panel. For example, only the first electrode in the red organic light emitting unit needs to be designed to be extended, and no additional unit is required for the green organic light emitting unit and the blue organic light emitting unit. Moreover, the transparent areas of the green organic light emitting unit and the blue organic light emitting unit are larger than the transparent area of the red organic light emitting unit as the light source. Through such arrangement, not only the fingerprint identification precision is ensured, but also a sufficient transparent area, through which signal light reflected through the touch body (such as the finger) passes, is ensured, so that the intensity of the signal light detected on the fingerprint identification unit is improved. In addition, a working voltage of the red organic light emitting unit may be properly increased to improve the intensity of the light emitted from the light source, so as to improve the intensity of the signal light detected on the fingerprint identification unit. In other embodiments, optionally, only the green organic light emitting unit serves as the light source for fingerprint identification. In this case, compared with the transparent area of the blue organic light emitting unit towards the side opposite to the display side of the display panel, the transparent area of the green organic light emitting unit towards the side opposite to the display side of the display panel is smaller; and compared with the transparent area of the red organic light emitting unit towards the side opposite to the display side of the display panel, the transparent area of the green organic light emitting unit towards the side opposite to the display side of the display panel is smaller.

Figure 2:
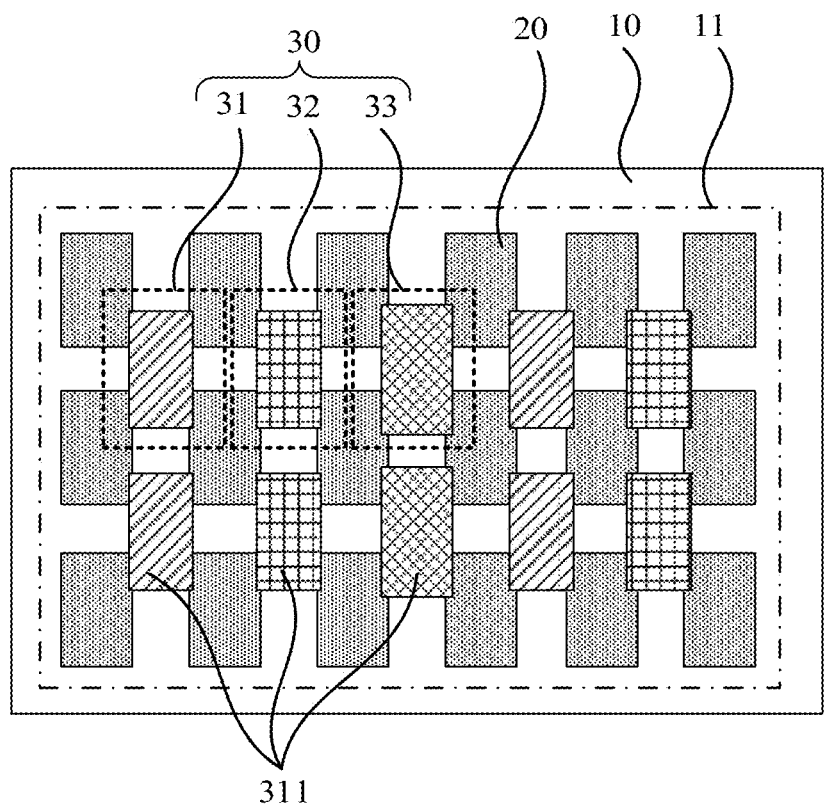
FIG. 2 is a top structural schematic diagram illustrating another display panel provided by embodiments of the present disclosure.

FIG. 2 is a schematic diagram of a top view illustrating another display panel provided by embodiments of the present disclosure. Optionally, as shown in FIG. 2, the area of the light emitting functional layer of the blue organic light emitting unit 33 is greater than the area of light emitting functional layer of the red organic light emitting unit 31; and the area of the light emitting functional layer of the blue organic light emitting unit 33 is greater than the area of light emitting functional layer of the green organic light emitting unit 32. Since the material of the light emitting functional layer of the blue organic light emitting unit has a shorter life than the material of light emitting functional layer of the red organic light emitting unit and the green organic light emitting unit, the light emitting functional layer of the blue organic light emitting unit is designed to have a larger area. Therefore, the light emitting functional layer of the blue organic light emitting unit is operated at a low voltage. Exemplarily, for example, the working voltage of the light emitting functional layers of the red organic light emitting unit and the green organic light emitting unit is set as 3V, and the working voltage of the light emitting functional layer of the blue organic light emitting unit is set as 2V to increase the working life of the blue organic light emitting unit. In this way, a balance in the working lives of the red organic light emitting unit, the green organic light emitting unit and the blue organic light emitting unit is achieved, thereby prolonging the working life of the entire display panel.

Figure 3A:
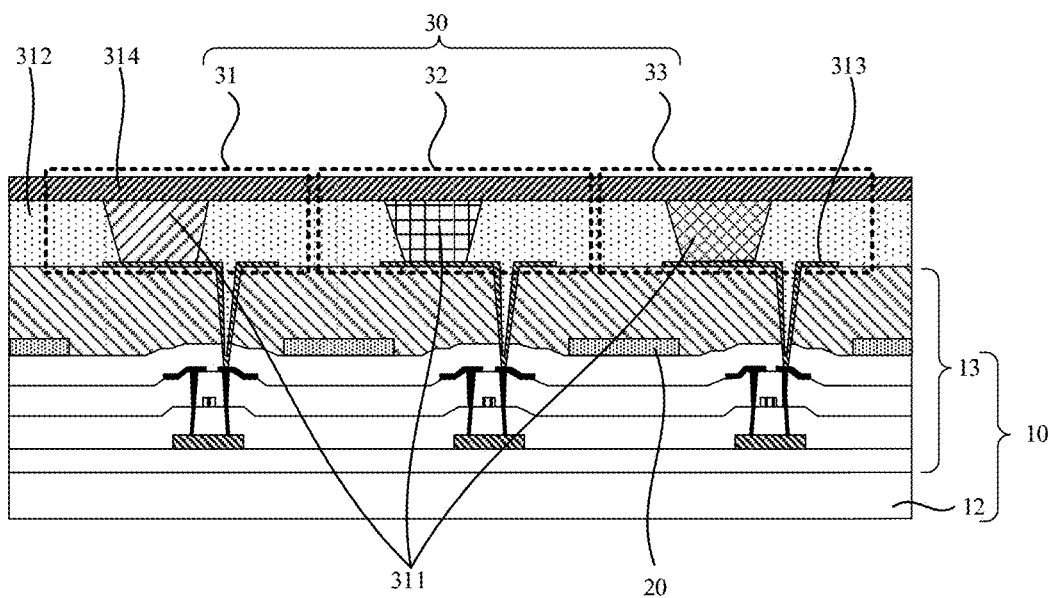
FIG. 3a is a schematic diagram of a cross section illustrating another display panel provided by embodiments of the present disclosure.
Figure 3B:
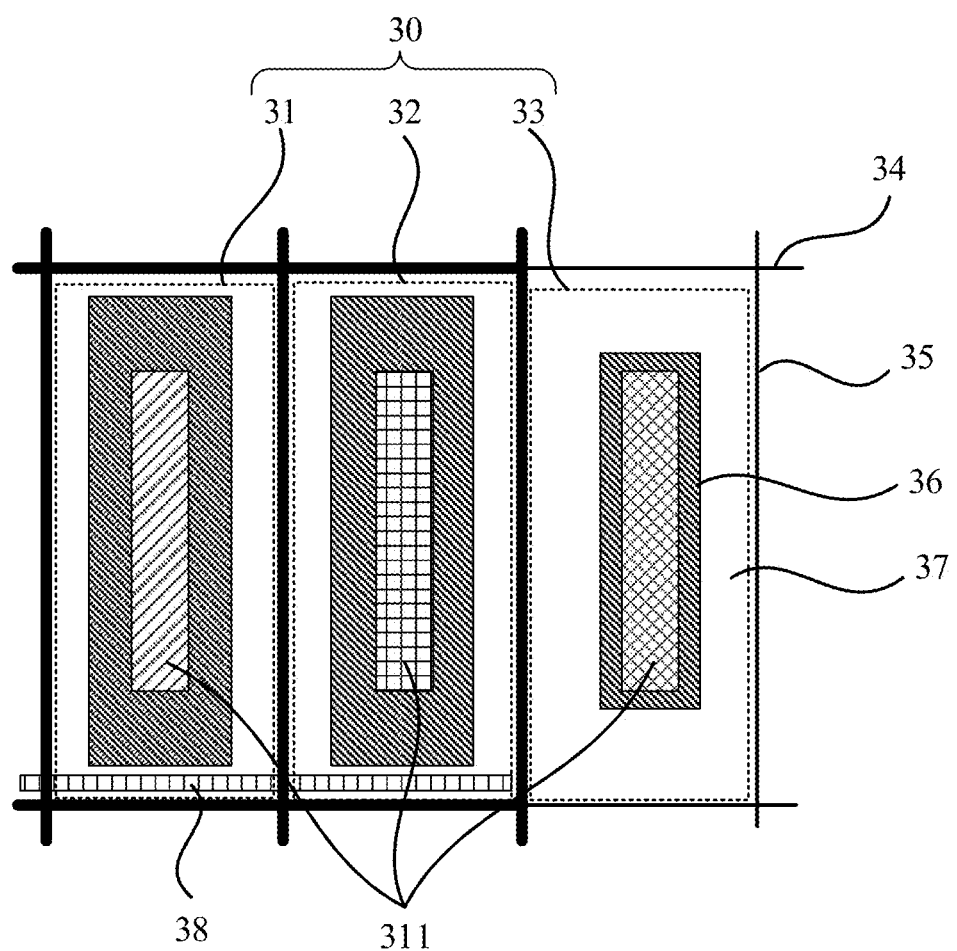
FIG. 3b is a zoom-in top view illustrating another S1 region provided by embodiments of the present disclosure.

FIG. 3a is a schematic diagram of a cross section illustrating another display panel provided by embodiments of the present disclosure. FIG. 3b is a zoom-in top view illustrating another S1 region provided by embodiments of the present disclosure. Optionally, With reference to FIG. 3a, the array substrate 10 includes a second substrate 12 and a plurality of pixel driving circuits 13 arranged on the second substrate 12. Each pixel driving circuit 13 is electrically connected with an associated organic light emitting unit 30. The fingerprint identification unit 20 is arranged between the second substrate 12 and the organic light emitting unit 30. Three pixel driving circuits 13 are exemplarily arranged in FIG. 3a. Each pixel driving circuit 13 is electrically connected with the first electrode 313 in the organic light emitting unit 30 respectively. A fingerprint identification module formed by the fingerprint identification unit 20, a metal connection wire and an IC driving circuit (not shown in the figure) are embedded into the display panel. In the present embodiment of the present disclosure, since the fingerprint identification module is embedded into the display panel, the thickness of the display panel is reduced and a thinner design of the display panel is realized.

Optionally, with reference to FIG. 3a and FIG. 3b, the area of the vertical projection, on the second substrate 12, of the pixel driving circuit 13 associated with the organic light emitting unit 30 as the light source for the fingerprint identification unit 20 is greater than the area of the vertical projection, on the second substrate 12, of the pixel driving circuit 13 associated with the organic light emitting unit 30 not serving as the light source for the fingerprint identification unit 20. The fingerprint identification unit 20 is arranged between the pixel driving circuit 13 and the second substrate 12.

Specifically, with reference to FIG. 3a and FIG. 3b, with respect to the organic light emitting units as the light sources for fingerprint identification, a scanning line 34 and a data line 35 in associated pixel driving circuit 13 can be designed to be widened, so as to block the stray light. Of course, positions or sizes of opaque elements in the pixel driving circuit 13 may also be changed to block the stray light without influencing an original function thereof. For example, the position of a capacitor metal plate 38 is changed to block the stray light on the basis of an original capacitor storage function.

Figure 3C:
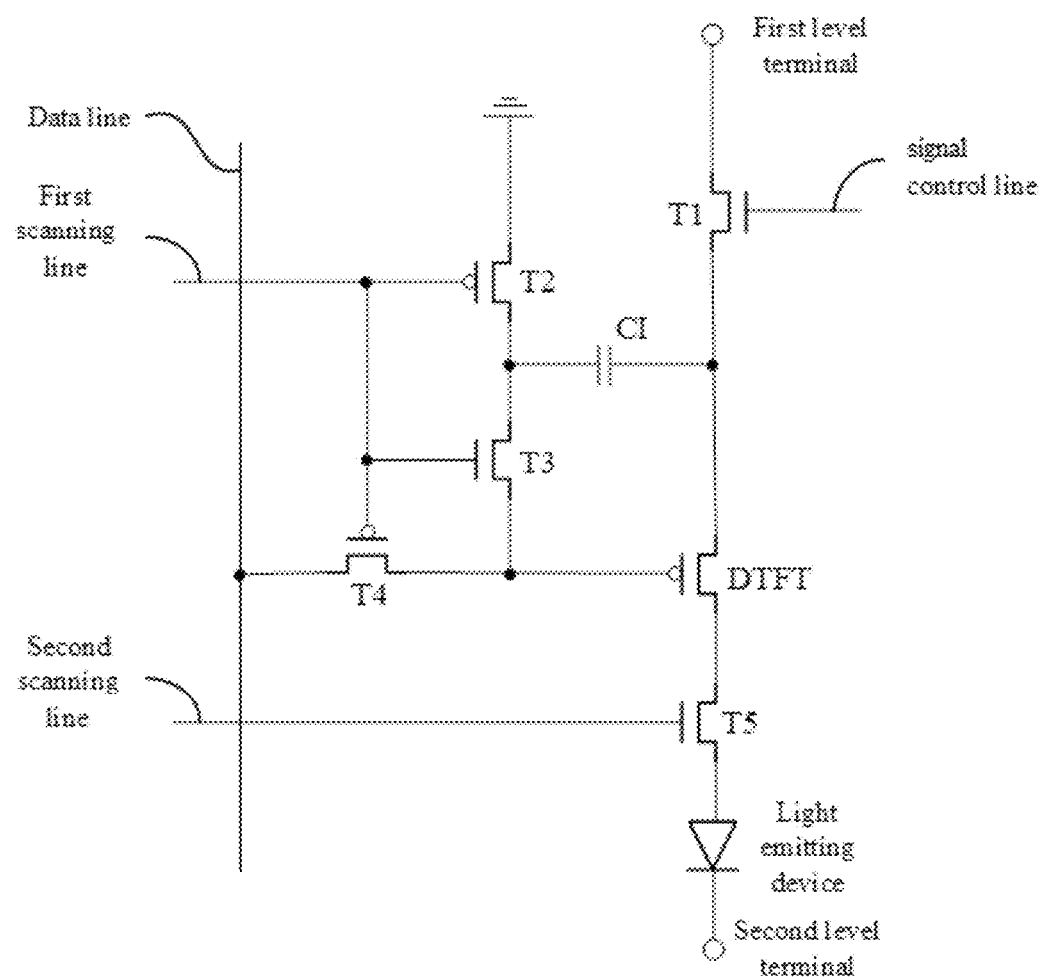
FIG. 3c is a structural schematic diagram illustrating a pixel driving circuit provided by embodiments of the present disclosure.
Figure 3D:
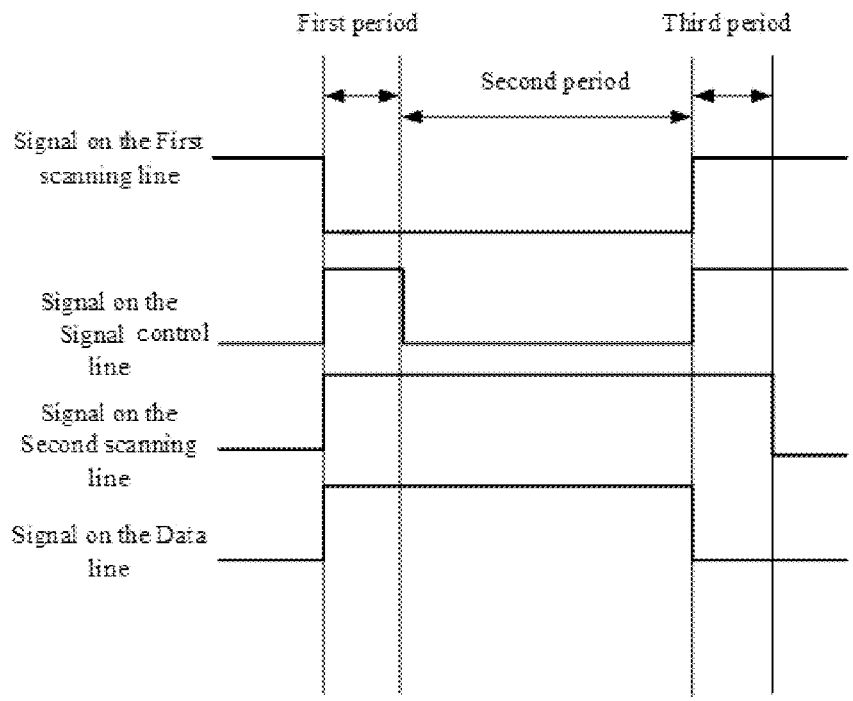
FIG. 3d is a schematic diagram illustrating a signal time sequence state of a pixel driving circuit provided by embodiments of the present disclosure.

FIG. 3c is a structural schematic diagram illustrating a pixel driving circuit provided by embodiments of the present disclosure. FIG. 3d is a schematic diagram illustrating a signal time sequence state of a pixel driving circuit provided by embodiments of the present disclosure. The scanning line 34 in FIG. 3b may be a signal control line, a first scanning line and a second scanning line in the pixel driving circuit provided in embodiments of the present disclosure. The data line 35 in FIG. 3b may be a data line in the pixel driving circuit provided in embodiments of the present disclosure. The capacitor metal plate 38 in FIG. 3b may be a storage capacitor CI in the pixel driving circuit provided in embodiments of the present disclosure. It can be understood that gates, sources and other opaque parts of a first thin film transistor T1 and a second thin film transistor T2 in the pixel driving circuit can also be used to block the stray light. With reference to FIG. 3c and FIG. 3d, the pixel driving circuit provided in embodiments of the present disclosure includes a data line, a first scanning line, a second scanning line, a signal control line, a light emitting device, a storage capacitor CI, a driving transistor DTFT and four switching transistors (T1-T5). The gate of the first switching transistor T1 is connected with the signal control line; the source of the first switching transistor T1 is connected with a first level terminal; and the drain of the first switching transistor T1 is connected with a first pole of the storage capacitor CI. The gate of the second switching transistor T2 is connected with the first scanning line; the source of the second switching transistor T2 is grounded; and the drain of the second switching transistor T2 is connected with a second pole of the storage capacitor CI. The gate of the third switching transistor T3 is connected with the first scanning line; and the source of the third switching transistor T3 is connected with the second pole of the storage capacitor CI. The gate of the fourth switching transistor T4 is connected with the first scanning line; the source of the fourth switching transistor T4 is connected with the data line; and a drain of the fourth switching transistor T4 is connected with the drain of the third switching transistor T3. The gate of the driving transistor DTFT is connected with the drain of the fourth switching transistor T4; and the source of the driving transistor DTFT is connected with the first pole of the storage capacitor CI. The gate of the fifth switching transistor T5 is connected with the second scanning line; the source of the fifth switching transistor T5 is connected with the drain of the driving transistor DTFT; the drain of the fifth switching transistor T5 is connected with one pole of the light emitting device; and the other pole of the light emitting device is connected with a second level terminal.

The first switching transistor T1, the third switching transistor T3 and the fifth switching transistor T5 are "N" type switching transistors, and the driving transistor DTFT, the second switching transistor T2 and the fourth switching transistor T4 are "P" type switching transistors.

A driving method of the pixel driving circuit provided in embodiments of the present disclosure is described below.

In a first phase, the first switching transistor T1, the second switching transistor T2, the fourth switching transistor T4 and the fifth switching transistor T5 are turned on, the third switching transistor T3 is turned off, so that the storage capacitor CI is charged by the first level terminal.

In a second phase, the second switching transistor T2, the fourth switching transistor T4 and the fifth switching transistor T5 are turned on, the first switching transistor T1 and the third switching transistor T3 are turned off, so that the storage capacitor CI discharges until a voltage difference between the gate and the source of the driving transistor DTFT is equal to a threshold voltage of the driving transistor DTFT.

In a third phase, the first switching transistor T1, the third switching transistor T3 and the fifth switching transistor T5 are turned on, the second switching transistor T2 and the fourth switching transistor T4 are tuned off, and the first level terminal and the second level terminal exert conducting signals to the light emitting device.

The fifth switching transistor T5 may be turned off after the display is ended, thereby protecting the light emitting device.

Figure 4:
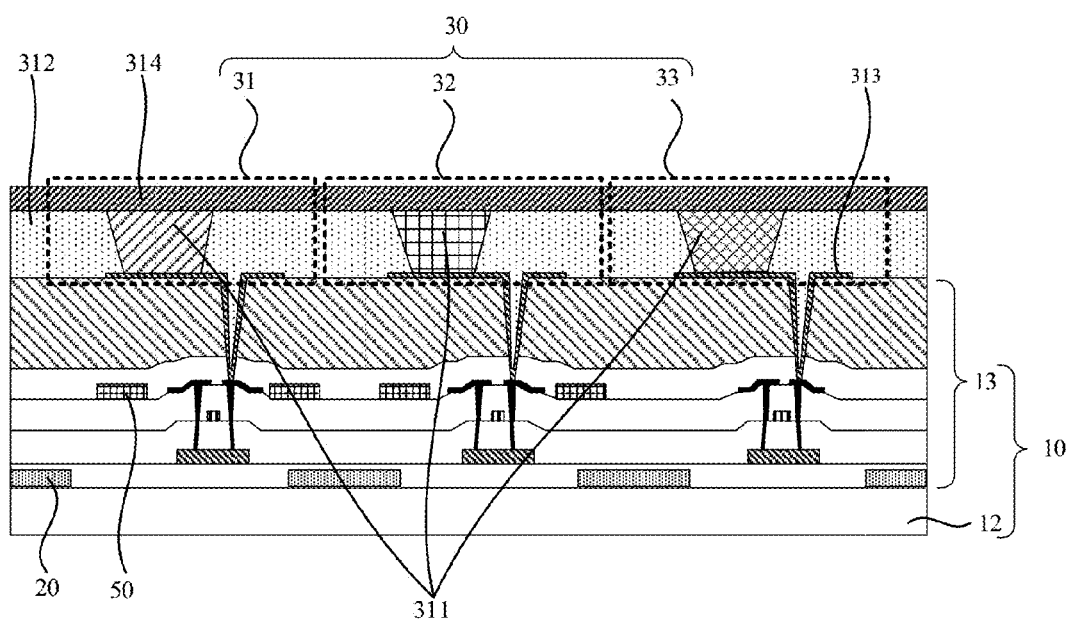
FIG. 4 is a schematic diagram of a cross section illustrating another display panel provided by embodiments of the present disclosure.

FIG. 4 is a schematic diagram of a cross section illustrating another display panel provided by embodiments of the present disclosure. Optionally, with reference to FIG. 4, the array substrate 10 further includes a plurality of shading pads 50. The shading pads 50 are arranged between the organic light emitting units 30 as the light sources of the fingerprint identification unit 20, and the fingerprint identification unit 20. Each organic light emitting unit 30 includes a first electrode 313, a light emitting functional layer 311 and a second electrode 314 sequentially along a direction in which the organic light emitting unit 30 faces away from the array substrate 10. The first electrode 313 is a reflective electrode. The area of a combination vertical projection, on the array substrate 10, of the first electrode 313 of the organic light emitting units 30 as the light sources of the fingerprint identification unit 20 and the shading pad 50 are greater than the area of the vertical projection, on the array substrate 10, of the first electrode 313 of the organic light emitting units 30 not serving as the light sources of the fingerprint identification unit 20. The combination vertical projection, on the array substrate 10, of the first electrode 313 and the shading pad 50 is a union of the vertical projection, on the array substrate 10, of the first electrode 313 and the vertical projection, on the array substrate 10, of the shading pad 50. Specifically, if A and B are sets, then a union of A and B is a set including all elements of A and all elements of B and excluding other elements.

Optionally, with reference to FIG. 4, the vertical projection, on the array substrate 10, of the border of the first electrode 313 of the organic light emitting units 30 as the light sources of the fingerprint identification unit 20 is located in the vertical projection, on the array substrate 10, of the shading pad 50. Such arrangement is equivalent to extension of the reflective electrode. That is, such arrangement is equivalent to keeping the area of the reflective electrode in the blue organic light emitting unit 33 unchanged and increasing the area of the reflective electrode in the red organic light emitting unit 31 and/or the green organic light emitting unit 32 compared with the existing art, so as to block the stray light. Embodiments of the present disclosure can effectively prevent the stray light from being irradiated on the fingerprint identification unit.

Optionally, with reference to FIG. 4, the array substrate 10 includes the second substrate 12 and the plurality of pixel driving circuits 13 arranged on the second substrate 12. Each pixel driving circuit 13 includes the data line, the scanning line and the capacitor metal plate (not shown in FIG. 4). The shading pads 50 are arranged on the same layer as the data line, the scanning line or the capacitor metal plate, thereby omitting a technological process. The shading pads can be made without adding a metal layer in the display panel, thereby increasing manufacturing efficiency and saving the production cost.

The shading pads 50 may be made of metal materials, or non-metal materials with a shading effect. The shading pads are used to prevent the stray light from being irradiated on the fingerprint identification unit in embodiments of the present disclosure, thereby improving the fingerprint identification precision. It should be noted that the above embodiments may be combined with each other to improve the fingerprint identification precision. For example, the reflective electrode of the organic light emitting unit as the light source is extended, meanwhile the pixel driving circuits are designed to block a part of the stray light (with reference to FIG. 3b). Optionally, the reflective electrode of the organic light emitting unit as the light source is extended, meanwhile the shading pads are designed to block a part of the stray light. Optionally, the shading pads are configured to block a part of the stray light, meanwhile the pixel driving circuits are designed to block a part of the stray light. Optionally, the reflective electrode of the organic light emitting unit as the light source is extended, meanwhile the pixel driving circuits are designed to block a part of the stray light, and the shading pads are configured to block a part of the stray light.

In addition to utilizing opaque objects to block stray light (shown in FIG. 1a to FIG. 4), it may be prevented from irradiating on the fingerprint identification unit by using a first polarizer at one side, close to the light exiting surface of the display module, of the second substrate in the display module. The fingerprint identification module is arranged at one side, facing away from the first polarizer, of the second substrate, and the fingerprint identification module includes a fingerprint identification layer and a second polarizer located at one side, close to the display module, of the fingerprint identification layer. In a fingerprint identification phase, light emitted from the light source at one side, facing away from the light exiting surface of the display module, of the first polarizer is reflected through the touch body (the finger) touching the display screen and forms a fingerprint signal light. At this moment, the polarizer and the second polarizer cooperate so that the fingerprint signal light passes through the polarizer and the second polarizer without any light intensity loss. Meanwhile, before the light not reflected through the touch body (fingerprint noise light) reaches the fingerprint identification layer, the second polarizer is configured to at least weaken the light intensity of the fingerprint noise light. Thus, interference of the fingerprint noise light can be decreased, and a signal-to-noise ratio can be increased, thereby improving the fingerprint identification precision of the fingerprint identification module.

The above light sources may have light emitting units in the display module so that a thickness of the display panel is not increased. Moreover, the fabrication steps are decreased and the production cost is reduced.

As for a part of light leaked from the side of the fingerprint identification module by the organic light emitting units in the display panel, the second polarizer may be a linear polarizer or a circular polarizer, so as to reduce the light intensity of this part of the fingerprint noise light by a half. Optionally, when the second polarizer is the linear polarizer, the first polarizer should be the linear polarizer having a consistent polarization direction with the second polarizer, so as to enable the fingerprint signal light to pass through the first polarizer and the second polarizer without any light intensity loss; and when the second polarizer is the circular polarizer, the first polarizer shall be the circular polarizer matched with the second polarizer, so as to enable the fingerprint signal light to pass through the first polarizer and the second polarizer without any light intensity loss.

Figure 5:
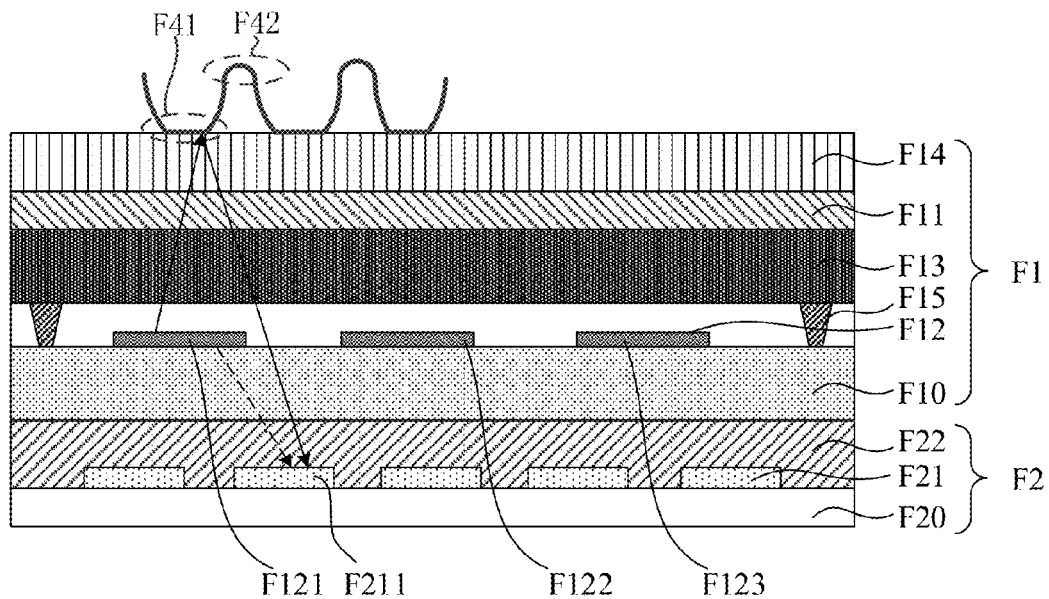
FIG. 5 is a structural schematic diagram illustrating another display panel provided by embodiments of the present disclosure.

Exemplarily, FIG. 5 is a structural schematic diagram illustrating a display panel provided by embodiments of the present disclosure. As shown in FIG. 5, the display panel in the present embodiment includes: a display module F1 including a second substrate F10 and a first polarizer F11 arranged on the second substrate F10, a light exiting surface of the display module F1 is located at one side, facing away from the second substrate F10, of the first polarizer F11; and a fingerprint identification module F2. The fingerprint identification module F2 is arranged at one side, facing away from the first polarizer F11, of the second substrate F10, and includes a fingerprint identification layer F21 and a second polarizer F22 arranged at one side, close to the display module F1, of the fingerprint identification layer F21. The fingerprint identification layer F21 is configured to perform fingerprint identification according to a fingerprint signal light formed by the light rays which are emitted from the light sources and reflected on the fingerprint identification layer through the touch body. The display module F1 further includes an organic light emitting layer F12 which is arranged between the second substrate F10 and the first polarizer F11 and configured to generate light for displaying images.

Optionally, the above organic light emitting layer F12 includes a plurality of organic light emitting units. For example, as shown in FIG. 5, the organic light emitting layer F12 may include a red organic light emitting unit F121, a green organic light emitting unit F122 and a blue organic light emitting unit F123. The above fingerprint identification layer F21 includes a plurality of fingerprint identification units F211.

Optionally, in the present embodiment, the organic light emitting layer F12 is multiplexed as the above light source. Exemplarily, the plurality of organic light emitting units and the plurality of fingerprint identification units are all arranged in an array. The fingerprint identification units and the organic light emitting units are correspondingly arranged. Beams of fingerprint signal light generated by one organic light emitting unit as the light source can be received by one or more fingerprint identification units associated with the organic light emitting unit. Optionally, the display panel includes a display region. The organic light emitting units and the fingerprint identification units are located in the display region. Thus, fingerprint identification can be realized in the display region of the display panel.

Optionally, in the present embodiment, the first polarizer includes a first linear polarizer, and the second polarizer includes a second linear polarizer. The polarization directions of the first linear polarizer and the second linear polarizer are consistent.

By continuing to refer to FIG. 5, a solid arrow indicates light rays emitted from the organic light emitting layer F12 to the light exiting surface and light rays of the fingerprint signal light formed after being reflected through the touch body; and a dotted arrow indicates light rays exposed by the organic light emitting layer F12 to the fingerprint identification module F2. Light emitted from the organic light emitting layer, such as the red organic light emitting unit F121 in FIG. 5, is first changed to linearly polarized light through the first polarizer F11. After being reflected through the touch body, the linearly polarized light is still linearly polarized light (it is fingerprint signal light at this moment) with the same polarization direction, and passes through the first polarizer F11 again without any light intensity loss. When the fingerprint signal light passes through the second polarizer F22, since the polarization direction of the second polarizer F22 and the polarization direction of the first polarizer F11 are consistent, the fingerprint signal light can pass through the second polarizer F22 without any light intensity loss and reach the fingerprint identification unit F211. However, the light exposed by the red organic light emitting unit F121 is light evenly distributed in various polarization directions, and is changed, after passing through the second polarizer F22, to light having only one polarization direction and a half of the intensity of the light is lost. Therefore, when the light exposed by the organic light emitting unit reaches the fingerprint identification unit F211, the light intensity is greatly reduced. In conclusion, under a condition that the light intensity of the fingerprint signal light is unchanged, the light intensity of the fingerprint noise light is relatively reduced. Therefore, a signal-to-noise ratio of the fingerprint identification module F2 is increased, thereby improving the fingerprint identification precision of the fingerprint identification module F2.

Optionally, the display panel in the present embodiment is a rigid display panel. Specifically, as shown in FIG. 5, the second substrate F10 is a second glass substrate. The display module F1 further includes a first glass substrate F13. The organic light emitting layer F12 is arranged between the second glass substrate F10 and the first glass substrate F13. The second glass substrate F10 and the first glass substrate F13 are supported by supporting pillars F15. An air gap exists between the second glass substrate F10 and the first glass substrate F13. Optionally, a thickness of the air gap is 4 μm. The display panel further includes a cover plate F14. The cover plate F14 is attached to a surface at one side, facing away from the organic light emitting layer, of the first polarizer F11 through a liquid optical adhesive. Optionally, a thickness of the display module is 1410 μm. In the present embodiment, the fingerprint identification module F2 further includes a first substrate F20. The fingerprint identification layer F21 is arranged on a surface of one side, close to the display module F1, of the first substrate F20. Thus, the fingerprint identification layer F21 may be directly made on the first substrate F20. Therefore, not only arrangement of the fingerprint identification layer F21 is facilitated, but also the first substrate F20 performs a protective effect on the fingerprint identification layer F21. In addition, the second polarizer F22 may be attached to the second substrate through an optical adhesive layer (not shown in the figure), to attach the display module F1 and the fingerprint identification module F2 together to form the display panel.

In addition, the first polarizer in embodiments of the present disclosure may include a first quarter-wave plate and a third linear polarizer which are stacked. The first quarter-wave plate is located at one side close to the organic light emitting layer of the third linear polarizer. The second polarizer may include a second quarter-wave plate and a fourth linear polarizer which are stacked. The second quarter-wave plate is located at one side close to the organic light emitting layer of the fourth linear polarizer. The first quarter-wave plate and the second quarter-wave plate are identical in materials and thicknesses.

Facing a transmission direction of the fingerprint signal light, by taking an anticlockwise direction as a forward direction, an inclined angle between a direction of an optical axis of the first quarter-wave plate and the polarization direction of the third linear polarizer is 45°, and an inclined angle between a direction of an optical axis of the second quarter-wave plate and the polarization direction of the fourth linear polarizer is −45°. Alternatively, the inclined angle between the direction of the optical axis of the first quarter-wave plate and the polarization direction of the third linear polarizer is −45°, and the inclined angle between the direction of the optical axis of the second quarter-wave plate and the polarization direction of the fourth linear polarizer is 45°. Thus, the first polarizer and the second polarizer are both circular polarizers.

Figure 6A:
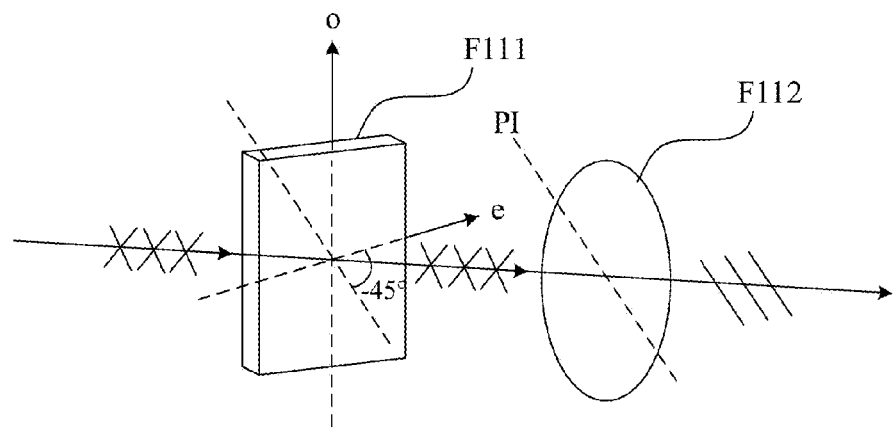
FIG. 6a is a schematic diagram illustrating an optical path before light emitted from an organic light emitting layer being reflected by a touch body according to embodiments of the present disclosure.
Figure 6B:
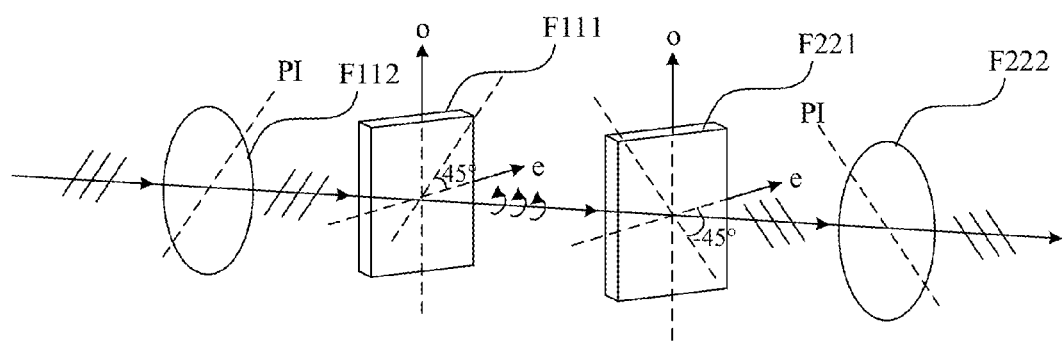
FIG. 6b is a schematic diagram illustrating an optical path after light emitted from an organic light emitting layer being reflected by a touch body according to embodiments of the present disclosure.
Figure 7:
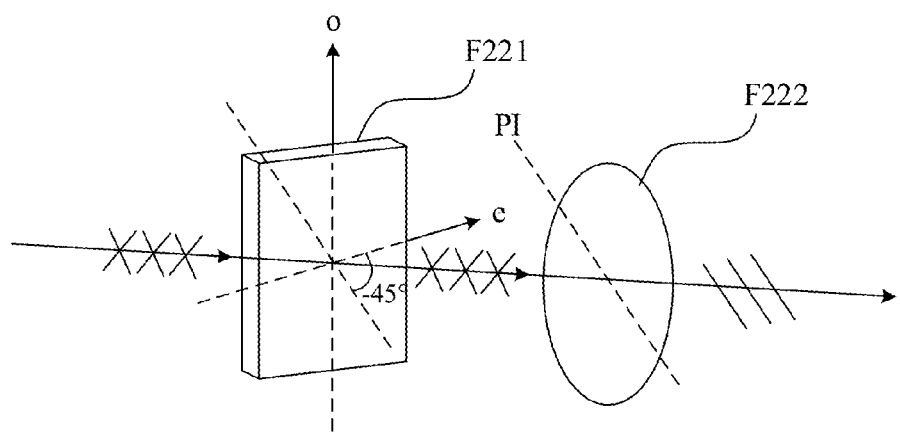
FIG. 7 is a schematic diagram illustrating an optical path of fingerprint noise light emitted from an organic light emitting layer according to embodiments of the present disclosure.

Exemplarily, description is made by taking the following situation as an example: facing a transmission direction of the fingerprint signal light, by taking the anticlockwise direction as the forward direction, the inclined angle between the direction of the optical axis of the first quarter-wave plate and the polarization direction of the third linear polarizer is 45°, and the inclined angle between the direction of the optical axis of the second quarter-wave plate and the polarization direction of the fourth linear polarizer is −45°. Both of the first quarter-wave plate and the second quarter-wave plate are made of calcite, and an "e" axis of the first quarter-wave plate and the second quarter-wave plate is used as the optical axis. By continuing to refer to FIG. 5, in the fingerprint identification phase, as shown in FIG. 6a, before the light emitted from the organic light emitting layer F12 is reflected by the touch body, facing the transmission direction of the light, by taking the anticlockwise direction as the forward direction, an inclined angle between a direction of the "e" axis of the first quarter-wave plate F111 and the polarization direction "PI" of the third linear polarizer F112 is −45°. The natural light emitted from the organic light emitting layer F12 is still natural light after passing through the first quarter-wave plate F111. Then, the natural light passes through the third linear polarizer F112 and is changed to linearly polarized light. A polarization direction of the linearly polarized light is identical with the polarization direction "PI" of the third linear polarizer F112, and is located in a second quadrant and a fourth quadrant. Referring to FIG. 6b, the linearly polarized light forms the fingerprint signal light after being reflected through the touch body, and is still linearly polarized light with an unchanged polarization direction. However, facing the transmission direction of the fingerprint signal light, the inclined angle between the direction of the "e" axis of the first quarter-wave plate F111 and the polarization direction of the third linear polarizer F112 is 45°, i.e., the fingerprint signal light is the linearly polarized light with the polarization direction in a first quadrant and a third quadrant. A polarization state and the light intensity of the fingerprint signal light are not changed when the fingerprint signal light passes through the third linear polarizer F112 again, and the fingerprint signal light becomes levorotatory circularly polarized light with the light intensity being unchanged when passing through the first quarter-wave plate F111. When passing through the second quarter-wave plate F221, the levorotatory circularly polarized light becomes the linearly polarized light with the polarization direction in the second quadrant and the fourth quadrant and has unchanged light intensity. Finally, the linearly polarized light with the unchanged light intensity is output through the fourth linear polarizer F222 with the polarization direction parallel with the polarization direction of the linearly polarized light. However, with reference to FIG. 7, the fingerprint noise light emitted from the organic light emitting layer directly enters the second polarizer. Facing the transmission direction of the fingerprint noise light, the inclined angle between the direction of the "e" axis of the second quarter-wave plate F221 and the polarization direction "PI" of the fourth linear polarizer F222 is −45°. The fingerprint noise light is still the natural light after passing through the second quarter-wave plate F221. The natural light passes through the fourth linear polarizer F222 to become linearly polarized light. The polarization direction of the linearly polarized light is identical with the polarization direction "PI" of the fourth linear polarizer F222, and is in the second quadrant and the fourth quadrant, but a half of the light intensity of the linearly polarized light is lost. Therefore, the second polarizer can reduce the light intensity of the fingerprint noise light to increase the signal-to-noise ratio.

Figure 8:
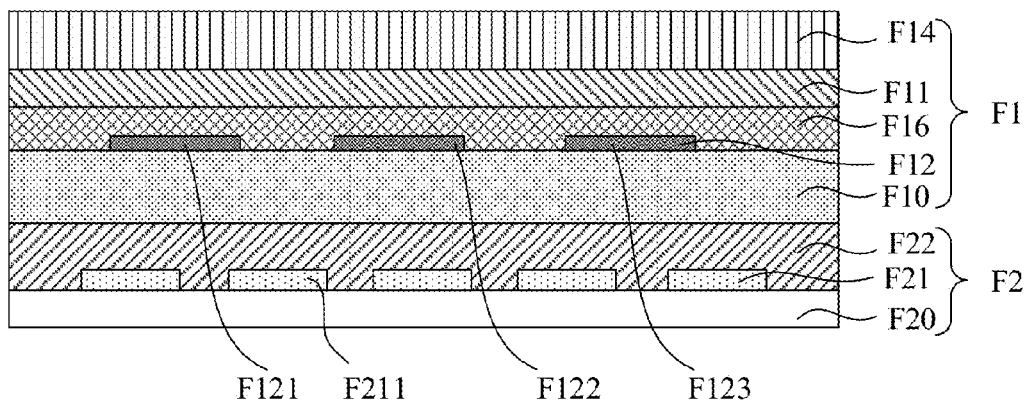
FIG. 8 is a structural schematic diagram illustrating another display panel provided by embodiments of the present disclosure.

FIG. 8 is a structural schematic diagram illustrating another display panel provided by embodiments of the present disclosure. The difference between the present embodiment and the above embodiment is that the display panel in the present embodiment is a flexible display panel. Specifically, as shown in FIG. 8, the second substrate F10 is a flexible substrate. The display module F1 further includes a film encapsulating layer F16 to replace the first glass substrate in above embodiments. The organic light emitting layer F12 is covered by the film encapsulating layer F16.

It should be noted that the directions of the optical axis of the quarter-wave plates and the polarization directions of the linear polarizers shown in FIG. 6a and FIG. 6b corresponding to above embodiments are only used to facilitate understanding. However, in embodiments of the present disclosure, as long as the inclined angle between the direction of the optical axis of the first quarter-wave plate and the polarization direction of the third linear polarizer and the inclined angle between the direction of the optical axis of the second quarter-wave plate and the polarization direction of the fourth linear polarizer meet limiting conditions of above embodiments, the direction of the optical axis of the first quarter-wave plate and the direction of the optical axis of the second quarter-wave plate have no specific relationship, and the polarization direction of the third linear polarizer and the polarization direction of the fourth linear polarizer also have no specific relationship.

The fingerprint identification unit in any of above embodiments of the present disclosure may include a fingerprint sensor.

Figure 9A:
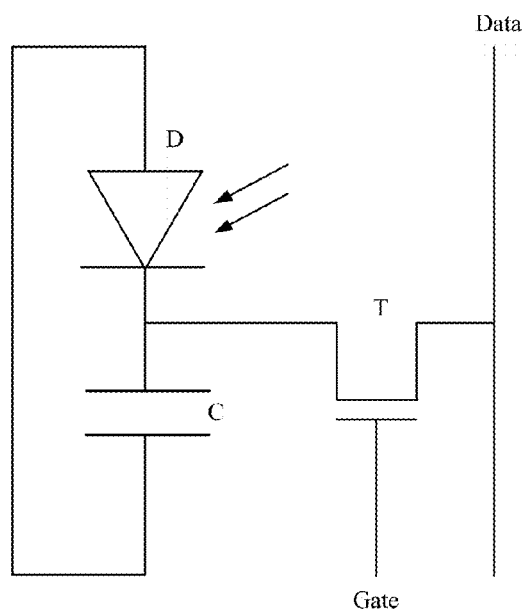
FIG. 9a is a circuit diagram illustrating a fingerprint sensor in a fingerprint identification module provided by embodiments of the present disclosure.
Figure 9B:
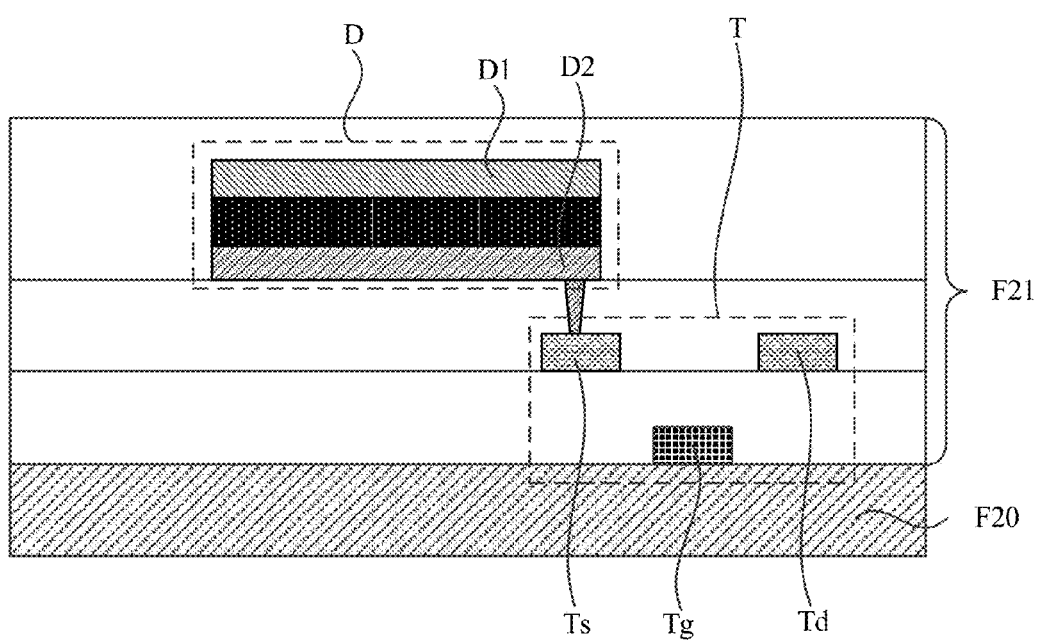
FIG. 9b is a schematic diagram of a cross section illustrating a fingerprint sensor in a fingerprint identification module provided by embodiments of the present disclosure.

Optionally, as shown in FIG. 9a and FIG. 9b, the above fingerprint sensor includes a photodiode "D", a storage capacitor "C" and a thin film transistor "T".

The photodiode "D" has a positive pole D1 electrically connected with a first electrode of the storage capacitor "C", and a negative pole D2 electrically connected with a second electrode of the storage capacitor "C" and the source Ts of the thin film transistor "T". The gate Tg of the thin film transistor "T" is electrically connected with a switch control line "Gate". The drain Td of the thin film transistor "T" is electrically connected with the signal detection line "Data". The photodiode "D" is configured to convert the fingerprint signal light into current signals. In the fingerprint identification phase, the switch control line "Gate" controls the thin film transistor T to be turned on, and the current signals are transmitted to the signal detection line "Data" through the thin film transistor "T" to perform fingerprint identification according to the current signals.

Besides the stray light irradiated on the fingerprint identification unit (as shown in FIG. 1a to FIG. 8), there exists other factors influencing fingerprint identification accuracy and precision. For example, the light rays reflected through different positions of the touch body may be irradiated on the same fingerprint identification unit, causing a serious crosstalk phenomenon in the fingerprint identification process and influencing accuracy and precision of fingerprint identification performed by the fingerprint identification sensor. For example, the light rays reflected through the ridge of the touch body and an adjacent valley may be irradiated on the same fingerprint identification unit. In this way, the fingerprint identification unit having received the light rays cannot detect accurate positions of the ridge and valley of the fingerprint, thereby causing a serious crosstalk phenomenon in the fingerprint identification process and influencing accuracy and precision of fingerprint identification performed by the fingerprint identification sensor.

In embodiments of the present disclosure, an angle-limiting film is arranged between the organic light emitting display panel and the fingerprint identification module, so as to filter out the following light rays among the light rays reflected on the fingerprint identification unit through the touch body: for the light rays, an incident angle relative to the angle-limiting film is greater than an penetration angle of the angle-limiting film. Compared with the existing art, in which the light rays reflected through different positions of the touch body are irradiated on the same fingerprint identification unit (e.g., the light rays reflected through ridges or valleys at different positions of the touch body may be irradiated on the same fingerprint identification unit), and the crosstalk phenomenon is caused, the light rays reflected on the same fingerprint identification unit through different positions of the touch body can be selectively filtered out through the angle-limiting film. Specifically, the light rays, for which the incident angle relative to the angle-limiting film is greater than the penetration angle of the angle-limiting film, can be filtered out, thereby effectively avoiding the crosstalk phenomenon caused by irradiating light rays reflected through different positions of the touch body on the same fingerprint identification unit, and improving accuracy and precision for fingerprint identification.

Figure 10A:
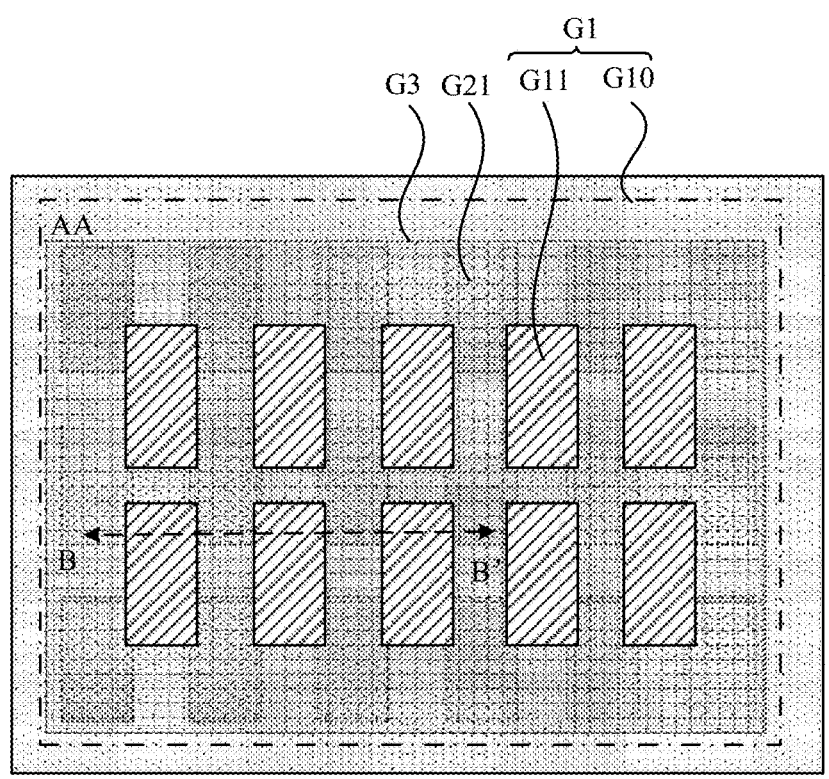
FIG. 10a is a top structural schematic diagram illustrating a display panel provided by embodiments of the present disclosure.
Figure 10B:
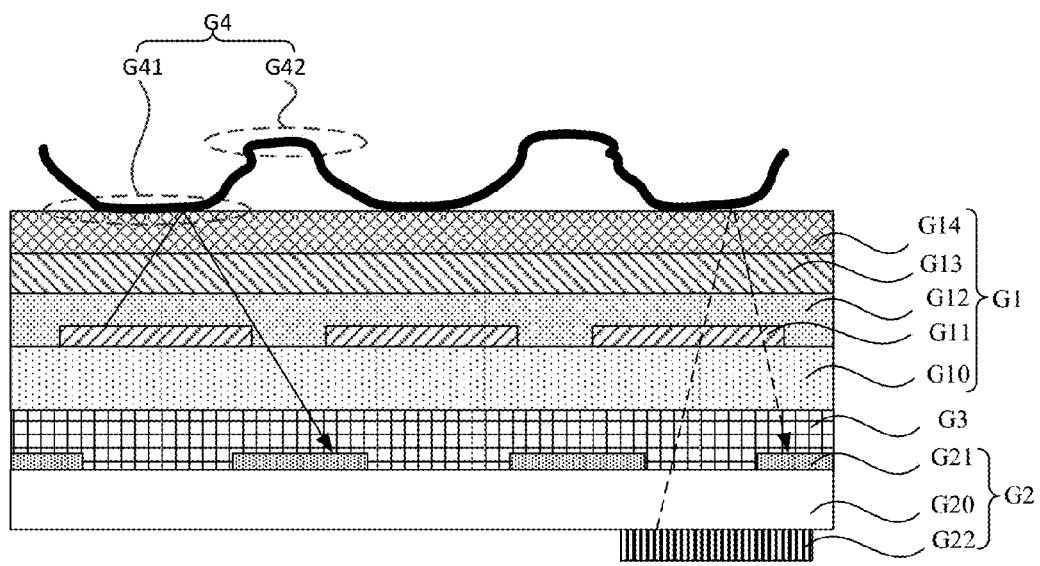

FIG. 10a is a schematic diagram of a top view illustrating a display panel provided by embodiments of the present disclosure. FIG. 10b is a schematic diagram of a cross section along line BB' in FIG. 10a. In combination with FIG. 10a and FIG. 10b, the display panel includes an organic light emitting display panel G1, a fingerprint identification module G2 and an angle-limiting film G3. The organic light emitting display panel G1 includes an array substrate G10, and a plurality of organic light emitting units G11 arranged on the array substrate G10. The fingerprint identification module G2 is located in a display region AA at one side, facing away from the organic light emitting units G11, of the array substrate G10. The fingerprint identification module G2 includes a first substrate G20, and at least one fingerprint identification unit G21 arranged on the first substrate G20. An angle-limiting film G3 is arranged between the organic light emitting display panel G1 and the fingerprint identification module G2.

The fingerprint identification module G2 is configured to perform fingerprint identification according to the light rays reflected on the fingerprint identification unit G21 through the touch body G4. The angle-limiting film G3 is configured to filter out the following light rays among light rays reflected on the fingerprint identification unit G21 through the touch body G4: the incident angle of the light rays relative to the angle-limiting film G3 is greater than the penetration angle of the angle-limiting film G3. The transmittance of the angle-limiting film G3 for vertical incident light rays may be set as "A". The penetration angle of the angle-limiting film G3 means the incident angle of the light rays with a transmittance of kA relative to the angle-limiting film G3, where 0<k<1. Light with the incident angle relative to the angle-limiting film G3 greater than the penetration angle of the angle-limiting film G3 can be filtered out by the angle-limiting film G3. Optionally, k is set to be equal to 0.1, namely the penetration angle of the angle-limiting film G3 is the incident angle of the light rays with the transmittance of 0.1 A relative to the angle-limiting film G3.

Optionally, the organic light emitting unit G11 is configured to provide a light source for the fingerprint identification module G2. The fingerprint identification unit G21 performs fingerprint identification according to the light rays emitted from the organic light emitting unit G11 and reflected on the fingerprint identification unit G21 through the touch body G4, such as the light rays indicated by solid lines shown in FIG. 10b. The angle-limiting film G3 is configured to filter out the following light rays among the light rays emitted from the organic light emitting unit G11 and reflected on the fingerprint identification unit G21 through the touch body G4: the incident angle of the light rays relative to the angle-limiting film G3 is greater than the penetration angle of the angle-limiting film G3. Therefore, the crosstalk phenomenon, caused by irradiating light emitted from the organic light emitting units G11 and reflected through different positions of the touch body G4 on the same fingerprint identification unit G21, is effectively avoided, thereby improving accuracy and precision for performing fingerprint identification by the fingerprint identification module.

Optionally, the transmittance of the light rays which are reflected vertically from the touch body G4 and irradiated on the fingerprint identification unit G21 through the organic light emitting display panel G1 may be greater than 1%. Specifically, when the fingerprint identification unit G21 performs fingerprint identification according to the light rays emitted from the organic light emitting units G11, if the transmittance of the light rays reflected vertically from the touch body G4 and irradiated on the fingerprint identification unit G21 through the organic light emitting display panel G1 is too small, the intensity of the light rays arrived at the fingerprint identification unit G21 is small, and the fingerprint identification precision is influenced. Exemplarily, as for the light rays reflected vertically from the touch body G4 and irradiated on the fingerprint identification unit G21 through the organic light emitting display panel G1, the transmittance may be adjusted by adjusting the thickness of each film through which the light rays pass.

Optionally, the display panel may include a light exiting side and a non-light exiting side. The light exiting side is the side, facing away from the array substrate G10, of the organic light emitting unit G11. The non-light exiting side is the side, facing away from the organic light emitting units G11, of the array substrate G10. When the fingerprint identification unit G21 performs fingerprint identification according to the light rays emitted from the organic light emitting units G11, a luminance ratio of the light exiting side to the non-light exiting side of the display panel may be greater than 10:1. Light rays on the non-light exiting side of the display panel will affect the process of fingerprint identification, in which the fingerprint identification is performed based on the light rays emitted from the organic light emitting units G11 and reflected on the fingerprint identification unit G21 through the touch body G4, performed by the fingerprint identification unit G21, so that there exists crosstalk in the light rays detected by the fingerprint identification unit. If the luminance at the non-light exiting side of the display panel is too great, the fingerprint identification precision may be seriously affected.

It should be noted that relative positions of the organic light emitting unit G11 and the fingerprint identification unit G21 illustrated in FIG. 10a and FIG. 10b are an example. The relative positions of the organic light emitting unit G11 and the fingerprint identification unit G21 are not limited in the embodiments of the present disclosure as long as the light rays emitted from the organic light emitting units G11 can be ensured to be reflected on the fingerprint identification unit G21 through the touch body G4.

Figure 11A:
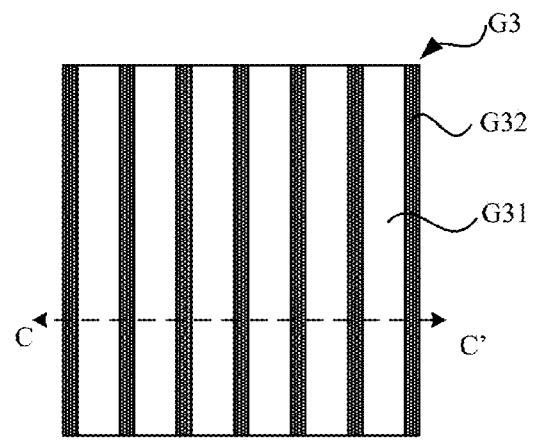
FIG. 11a is a top structural schematic diagram illustrating an angle-limiting film provided by embodiments of the present disclosure.
Figure 11B:
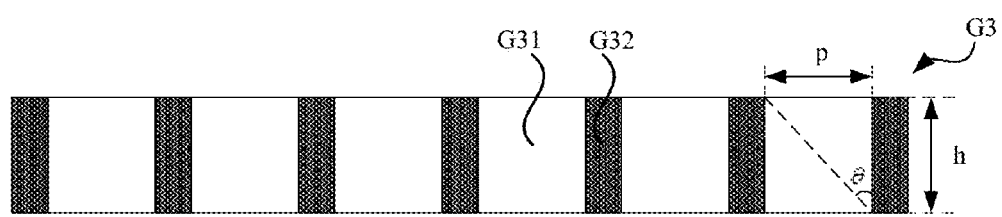

FIG. 11a is a schematic diagram of a top view illustrating an angle-limiting film provided by embodiments of the present disclosure. FIG. 11b is a schematic diagram of a cross section along line CC' in FIG. 11a. In combination with FIG. 11a and FIG. 11b, the angle-limiting film G3 includes a plurality of opaque regions G32 and a plurality of transparent regions G31. The opaque regions G32 and the transparent regions G31 are parallel to a plane in which the first substrate G20 is located, and are arranged at intervals along the same direction. The opaque regions G32 are provided with light absorbing materials.

Specifically, since the opaque regions G32 are provided with light absorbing materials, the light rays are absorbed by the light absorbing materials in the opaque regions G32 when being irradiated on the opaque regions G32. That is, the part of light reflected through the touch body G4 fail to pass through the angle-limiting film G3 to be irradiated on the fingerprint identification unit G21, and is effectively filtered out by the angle-limiting film G3. As shown in FIG. 11b, since the light rays irradiated on the opaque regions G32 are absorbed by the light absorbing materials in the regions, the penetration angle of the angle-limiting film G3 meets the following formula:

$$\theta = \arctan\frac{p}{h}$$

where "θ" is the penetration angle of the angle-limiting film G3; "p" is the width of each transparent region G31 along an arrangement direction of the transparent regions G31; and "h" is the thickness of the angle-limiting film G3. It can be seen from FIG. 11b that "θ", "p" and "h" meet a computation relationship of tan θ=p/h. Therefore, the penetration angle of the angle-limiting film G3 meets the above formula. Since the light rays irradiated on the opaque regions G32 will be absorbed by the light absorbing materials in such regions, light rays with the incident angle relative to the angle-limiting film G3 greater than the computed penetration angle can be filtered out by the angle-limiting film G3. Such part of light rays is not required for the fingerprint identification. The arrangement of the angle-limiting film G3 can prevent the light rays with the incident angle relative to the angle-limiting film G3 greater than the penetration angle of the angle-limiting film G3 from being irradiated on the fingerprint identification unit G21, thereby avoiding an interference to the fingerprint identification process.

Optionally, in the case that the angle-limiting film G3 includes a plurality of opaque regions G32 and transparent regions G31 which are parallel to the plane of the first substrate G20 and arranged at intervals along the same direction, and the opaque regions G32 are provided with the light absorbing materials, a diffusion distance of the angle-limiting film G3 meets the following formula:

$$\Delta X = \frac{p \cdot (H + h)}{h}$$

where ΔX is the diffusion distance of the angle-limiting film G3; and "H" is the thickness of the organic light emitting display panel G1. The diffusion distance of the angle-limiting film G3 means a distance between the following two reflection points on the touch body G4: the reflection point of the actual detection light rays associated with a fingerprint identification unit G21, and the reflection point of interference detection light rays associated with the same fingerprint identification unit G21. A reflection light ray with a minimum incident angle relative to the fingerprint identification unit G21 is the actual detection light ray. Compared with the incident angle of the actual detection light ray relative to the fingerprint identification unit G21, a reflection light ray with greater incident angle relative to the fingerprint identification unit G21 is the interference detection light ray.

Figure 11C:
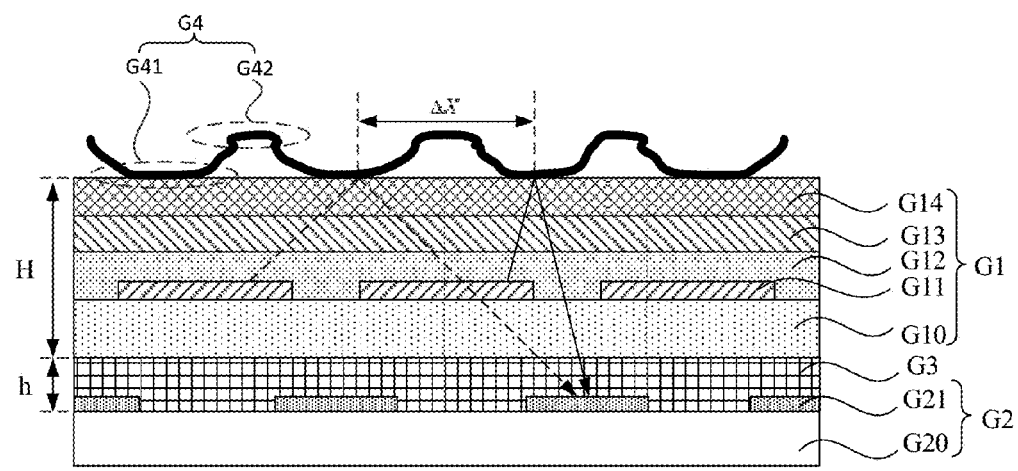
FIG. 11c is a schematic diagram of a cross section illustrating another display panel provided by embodiments of the present disclosure.

Exemplarily, as shown in FIG. 11c, description is made by taking the following situation as an example: the fingerprint identification unit G21 performs fingerprint identification according to the light rays emitted from the organic light emitting units G11 and reflected on the fingerprint identification unit G21 through the touch body G4. The light ray indicated by solid lines in FIG. 11c is the reflection light ray with the minimum incident angle relative to the fingerprint identification unit G21, i.e. the actual detection light ray, and the light ray indicated by dotted lines in FIG. 11c is the reflection light ray with a greater incident angle relative to the fingerprint identification unit G21 compared with the incident angle of the actual detection light ray relative to the fingerprint identification unit G21, i.e. the interference detection light ray. In the case that no angle-limiting film G3 is arranged, the actual detection light ray and the interference detection light ray are irradiated on the same fingerprint identification unit G21 after being reflected through different positions of the touch body G4, such as two adjacent ridges G41. In other words, there exists crosstalk in the fingerprint identification process in that case.

Figure 11D:
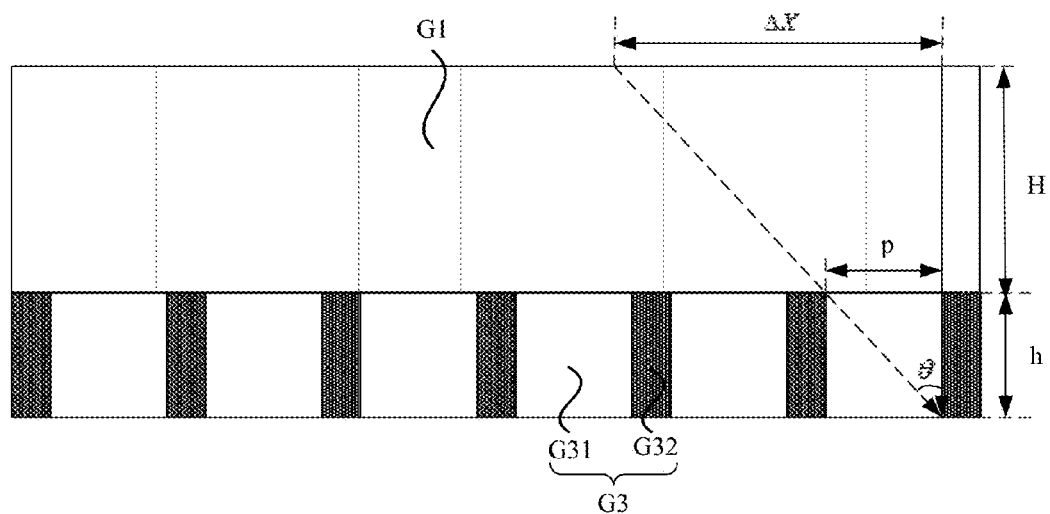

In this case, the diffusion distance of the angle-limiting film G3 is a distance between the following reflection points on the touch body G4: the reflection point of the actual detection light ray shown in the FIG. 11c, and the reflection point of the interference detection light ray shown in the FIG. 11c. Exemplarily, as shown in FIG. 11d, the incident angle of the actual detection light ray relative to the fingerprint identification unit G21 is approximately 0°. As for the interference light rays that can pass through the angle-limiting film G3, a minimum incident angle relative to the fingerprint identification unit G21 may be the penetration angle of the angle-limiting film G3. Therefore, the following computation relationship is met:

$$\tan\theta = \frac{p}{h} = \frac{\Delta X}{H+h}.$$

Therefore, the diffusion distance of the angle-limiting film G3 meets the above formula. The larger the diffusion distance of the angle-limiting film G3 is, the lower the accuracy and the precision of fingerprint identification performed by the display panel are.

Figure 11E:
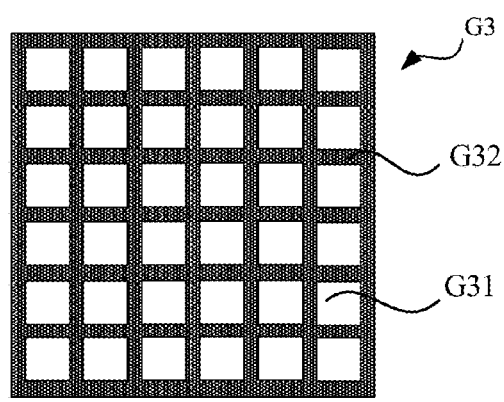
FIG. 11e is a schematic diagram of a top view illustrating another angle-limiting film provided by embodiments of the present disclosure.

In FIG. 11a, the angle-limiting film G3 is exemplarily configured as a one-dimensional structure in which the transparent regions G31 and the opaque regions G32 are arranged at intervals along the horizontal direction in FIG. 11a. However, the angle-limiting film G3 can also be configured as a two-dimensional structure as shown in FIG. 11e. In this case, the transparent regions G31 and the opaque regions G32 are arranged at intervals along a diagonal direction of the angle-limiting film G3 shown in FIG. 11e. Compared with the angle-limiting film G3 of the one-dimensional structure, the angle-limiting film G3 of the two-dimensional structure can selectively filter out the light rays being incident on the angle-limiting film G3 in all directions.

Figure 12A:
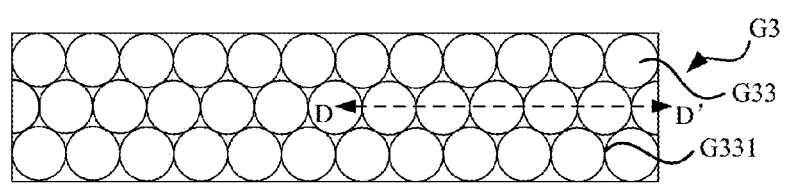
FIG. 12a is a top structural schematic diagram illustrating another angle-limiting film provided by embodiments of the present disclosure.
Figure 12B:
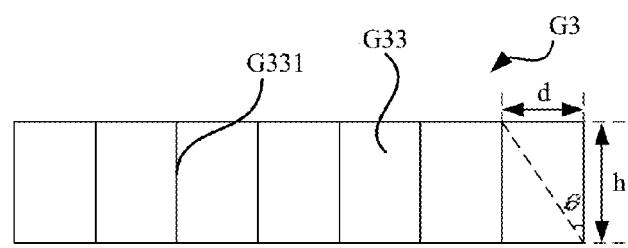

FIG. 12a is a schematic diagram of a top view illustrating another angle-limiting film provided by embodiments of the present disclosure. FIG. 12b is a schematic diagram of a cross section along line DD' in FIG. 12a. With reference to FIG. 12a and FIG. 12b, the angle-limiting film includes porous units G33. The light rays incident on a side wall G331 of each of the porous units G33 are absorbed by the side wall G331. In other words, the light rays incident on the side wall G331 fail to be irradiated on the fingerprint identification unit 421. Exemplarily, the porous unit G33 may be a glass capillary. The side wall G331 of the glass capillary is coated with black light absorbing materials, and thus the side wall G331 can absorb the light rays incident on the side wall G331, thereby filtering out a part of light rays by the angle-limiting film G3. Optionally, the light absorbing materials may be or may not be arranged between adjacent porous units G33.

Specifically, since the light rays incident on the side wall G331 are absorbed by the side wall G331 of the porous unit G33, the penetration angle of the angle-limiting film G3 meets the following formula:

$$\theta = \arctan\frac{d}{h},$$

where "θ" is the penetration angle of the angle-limiting film G3; "d" is a diameter of the porous unit G33; and "h" is the thickness of the angle-limiting film G3. It can be seen from FIG. 12b that "θ", "d" and "h" comply with a computation relationship of $$\tan\theta = \frac{d}{h}.$$

Therefore, the penetration angle of the angle-limiting film G3 meets the above formula.

Optionally, when the angle-limiting film G3 includes porous units G33 and the side wall G331 of each of the porous units G33 can absorb the light rays incident on the side wall G331, the diffusion distance of the angle-limiting film G3 meets the following formula:

$$\Delta X = \frac{d \cdot (H+h)}{h}$$

where ΔX is the diffusion distance of the angle-limiting film G3; and "H" is the thickness of the organic light emitting display panel G1. A derivation process of the formula is similar to the derivation process of the diffusion distance of the angle-limiting film G3 with the structure shown in FIG. 11a, and is not repeated herein. Similarly, the larger the diffusion distance of the angle-limiting film G3 is, the lower the accuracy and the precision of fingerprint identification performed by the display panel are.

Figure 12C:
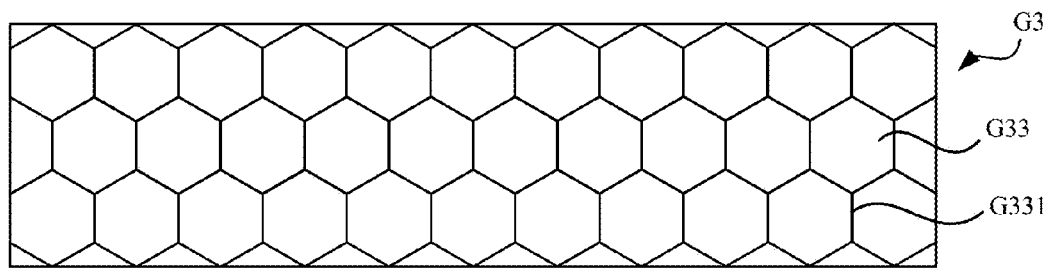
FIG. 12c is a top view schematic diagram illustrating another angle-limiting film provided by embodiments of the present disclosure.

It should be noted that, when being viewed for the top, the porous units G33 of the angle-limiting film G3 may have a circular shape as shown in FIG. 12a or an orthohexagonal shape as shown in FIG. 12c. Shapes of the porous units G33 are not limited in embodiments of the present disclosure.

Figure 13A:
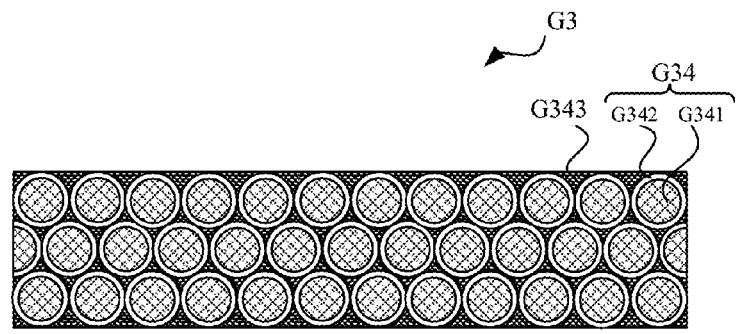
FIG. 13a is a top structural schematic diagram illustrating another angle-limiting film provided by embodiments of the present disclosure.
Figure 13B:
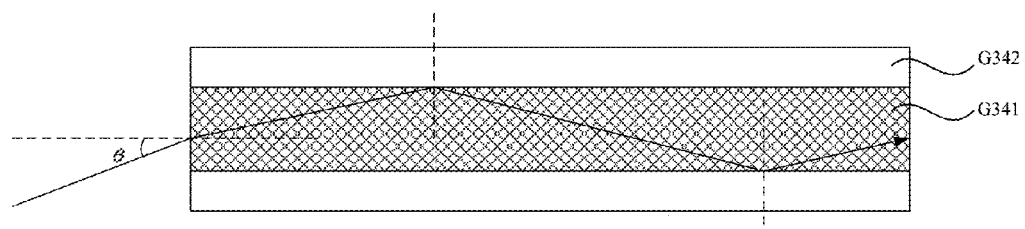

FIG. 13a is a schematic diagram of a top view illustrating another angle-limiting film provided by embodiments of the present disclosure. As shown in FIG. 13a, the angle-limiting film G3 includes a plurality of optical fiber units G34 arranged along the same direction. FIG. 13b is a schematic diagram of a cross section along an extension direction of the optical fiber units G34 in FIG. 13a. With reference to FIG. 13a and FIG. 13b, each of the optical fiber units G34 includes an inner core G341 and an outer shell G342. Light absorbing materials G343 are provided between every two adjacent optical fiber units G34. Therefore, the light rays leaked to a region between two optical fiber units G34 from the optical fiber unit G34 can be absorbed by the light absorbing materials G343, so as to filtering out a part of the light rays by the angle-limiting film G3.

Specifically, the inner core G341 and the outer shell G342 of the optical fiber unit G34 have different refractive indexes. The penetration angle of the angle-limiting film G3 meets the following formula:

$$n \cdot \sin\theta = \sqrt{n_{core}^2 - n_{clad}^2}$$

where θ is the penetration angle of the angle-limiting film G3; "n" is the refractive index of a film, which comes into contact with the angle-limiting film G3, in the organic light emitting display panel G1; $n_{core}$ is the refractive index of the inner core G341 of the optical fiber unit G34; and $n_{clad}$ is the refractive index of the outer shell G342 of the optical fiber unit G34. As shown in FIG. 13b, if the incident angle, relative to the angle-limiting film G3 formed with the optical fiber units G34, of the light rays reflected from the touch body G4 is greater than θ, a total reflection will not occurred to these light rays in the optical fiber units G34. In other words, these light rays can pass through the optical fiber units G34 and are absorbed by the light absorbing materials G343 between the optical fiber units G34. As a result, such part of the light rays is filtered out by the angle-limiting film G3, and fail to be irradiated on the fingerprint identification unit G21. Therefore, with the angle-limiting film G3, the light rays with an incident angle relative to the angle-limiting film G3 greater than the penetration angle of the angle-limiting film G3 can be filtered out. The crosstalk phenomenon caused by that the light rays emitted from the fingerprint identification light sources are irradiated on the same fingerprint identification unit G21 after being reflected from different positions of the touch body G4 is avoided, and the accuracy and precision for fingerprint identification are improved.

Figure 13C:
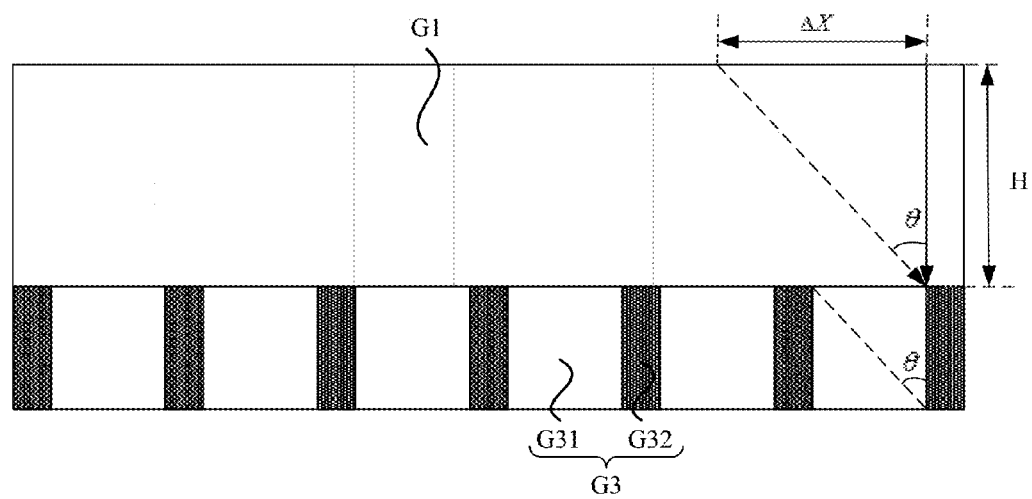

Optionally, in the case that the angle-limiting film G3 includes a plurality of optical fiber units G34 arranged along the same direction, the inner core G341 and the outer shell G342 of the optical fiber units G34 have different refractive indexes, and light absorbing materials G343 are provided between every two adjacent optical fiber units G34, the diffusion distance of the angle-limiting film G3 meets the following formula:

$$\Delta X = H \cdot \tan \theta$$

where ΔX is the diffusion distance of the angle-limiting film G3; and "H" is the thickness of the organic light emitting display panel G1. As shown in FIG. 13c, the incident angle of the actual detection light ray relative to the fingerprint identification unit G21 is approximately 0°. As for the interference light rays that can pass through the angle-limiting film G3, a minimum incident angle relative to the fingerprint identification unit G21 may be the penetration angle of the angle-limiting film G3, i.e., a critical value of the incident angle at which the total reflection will occur to the light rays in the optical fiber units G34. Therefore, the following computation relationship is met $$\tan \theta = \frac{\Delta X}{H}.$$

Similarly, the larger the diffusion distance of the angle-limiting film G3 is, the lower the accuracy and the precision of fingerprint identification performed by the display panel are.

Figure 14A:
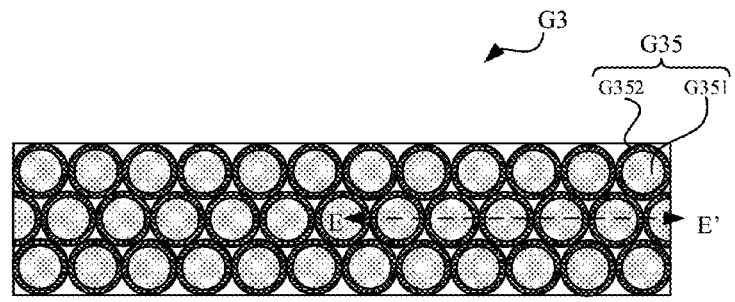
FIG. 14a is a top structural schematic diagram illustrating another angle-limiting film provided by embodiments of the present disclosure.
Figure 14B:
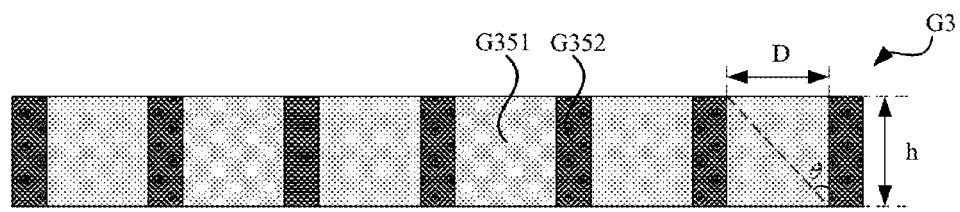

FIG. 14a is a schematic diagram of a top view illustrating another angle-limiting film provided by embodiments of the present disclosure. FIG. 14b is a schematic diagram of a cross section along line EE' in FIG. 14a. With reference to FIG. 14a and FIG. 14b, the angle-limiting film G3 includes a plurality of columnar units G35 arranged along the same direction. Each of the columnar units G35 includes an inner core G351 and an outer shell G352. The inner core G351 and the outer shell G352 have the same refractive index, and the outer shell G352 includes light absorbing materials. Therefore, the light rays passing through the inner core G351 and being irradiated on the outer shell G352 are absorbed by the outer shell G352. In other words, the light rays irradiated on the outer shell G352 fail to irradiate the fingerprint identification unit G21. Optionally, the light absorbing materials may be or may not be provided between adjacent columnar units G35.

Specifically, the light rays passing through the inner core G351 and being irradiated on the outer shell G352 are absorbed by the outer shell G352. Therefore, the penetration angle of the angle-limiting film G3 meets the following formula:

$$\theta = \arctan \frac{D}{h}$$

where "θ" is the penetration angle of the angle-limiting film G3; "D" is the diameter of the inner core G351; and "h" is the thickness of the angle-limiting film G3. It can be seen from FIG. 14b that "θ", "D" and "h" comply with a computation relationship of $$\tan \theta = \frac{D}{h}.$$

Therefore, the penetration angle of the angle-limiting film G3 meets the above formula.

Optionally, in the case that the angle-limiting film G3 includes a plurality of columnar units G35 arranged along the same direction, each of the columnar units G35 includes the inner core G351 and the outer shell G352, the inner core G351 and the outer shell G352 have the same refractive index, and the outer shell G352 includes the light absorbing materials, the diffusion distance of the angle-limiting film G3 meets the following formula:

$$\Delta X = \frac{D \cdot (H + h)}{h}$$

where ΔX is the diffusion distance of the angle-limiting film G3; and "H" is the thickness of the organic light emitting display panel G1. A derivation process of the formula is similar to the derivation process of the diffusion distance of the angle-limiting film G3 with the structure shown in FIG. 11a, and is not repeated herein. The larger the diffusion distance of the angle-limiting film G3 is, the lower the accuracy and the precision of fingerprint identification performed by the display panel are.

It should be noted that, as viewed from the top of the angle-limiting film G3, shapes of the columnar units G35 can be correspondingly a circular structure shown in FIG. 14a or can be correspondingly structures of other shapes. The shapes of the columnar units G35 are not limited by embodiments of the present disclosure.

Optionally, the diffusion distance of the angle-limiting film G3 is less than 400 μm. The larger the diffusion distance of the angle-limiting film G3 is, the larger the distance between the following two reflection points on the touch body G4 is: the reflection point of the interference detection light rays on the touch body G4, and the reflection point of the actual detection light rays on the touch body G4. When the distance between the reflection points on the touch body G4 of the actual detection light rays and the interference detection light rays is greater than the distance between the valley G42 and an adjacent ridge G41 in the fingerprint, the fingerprint identification process of the display panel may have an error. As a result, the fingerprint identification cannot be performed, and the fingerprint identification accuracy of the display panel is seriously affected.

Optionally, the organic light emitting unit G11 is configured to provide an light source for the fingerprint identification module G2. When the fingerprint identification is performed by the fingerprint identification units G21 according to the light rays emitted from the organic light emitting units G11 and then reflected on the fingerprint identification units G21 through the touch body G4, in the fingerprint identification phase, only one organic light emitting unit G11 emits light within a range twice of the diffusion distance of the angle-limiting film G3. Specifically, since only one organic light emitting unit G11 emits light within a range twice of the diffusion distance of the angle-limiting film G3, a probability that the light rays emitted from different organic light emitting units G11 are reflected to the same fingerprint identification unit G21 through different parts of the touch body G4 can be significantly reduced. Accordingly, a crosstalk phenomenon, caused by irradiating the same fingerprint identification unit G21 with the light emitted from the fingerprint identification light sources and then reflected through different parts of the touch body G4, is reduced, thereby improving accuracy and precision for fingerprint identification.

Optionally, an optical adhesive layer is arranged between the fingerprint identification module G2 and the angle-limiting film G3, and is configured to bond the fingerprint identification module G2 and the angle-limiting film G3. Optionally, the fingerprint identification unit G21 includes an optical fingerprint sensor configured to perform fingerprint detection and identification according to the light rays reflected through the touch body G4. Exemplarily, the fingerprint identification unit G21 includes light absorbing materials such as amorphous silicon or gallium arsenide or arsenic sulfide, or other light absorbing materials. The materials of the fingerprint identification unit G21 are not limited by embodiments of the present disclosure.

Optionally, as shown in FIG. 10b and FIG. 11c, the display panel may further include an encapsulating layer G12, a polarizer G13 and a cover glass G14 sequentially arranged on the organic light emitting units G11. The encapsulating layer G12 may include an encapsulating glass or a film encapsulating layer. When the encapsulating layer G12 includes an encapsulating glass, the display panel cannot bend. When the encapsulating layer G12 includes a film encapsulating layer, the display panel may be bent. Optionally, the first substrate G20 as the base of the fingerprint identification unit G21 may include a glass substrate or a flexible substrate. The cover glass G14 may bonded to the polarizer G13 with optical adhesive.

Optionally, the display panel further includes a touch electrode layer. The touch electrode layer is arranged between the encapsulating layer G12 and the polarizer G13, or between the cover glass G14 and the polarizer G13. The display panel integrated with the touch electrode can realize a touch function while displaying.

It should be noted that drawings shown in embodiments of the present disclosure only exemplarily indicate sizes of all elements and thicknesses of all films, and do not represent actual sizes of all the elements and all the films in the display panel.

According to embodiments of the present disclosure, the angle-limiting film G3 is arranged between the organic light emitting display panel G1 and the fingerprint identification module G2, and is capable of filtering out the following light rays among the light rays reflected on the fingerprint identification unit G21 through the touch body G4: the light rays with an incident angle relative to the angle-limiting film G3 greater than the penetration angle of the angle-limiting film G3. That is, the light rays reflected on the same fingerprint identification unit G21 through different parts of the touch body G4 in the existing art, can be selectively filtered out through the angle-limiting film G3, thereby effectively avoiding the crosstalk phenomenon caused by irradiating the same fingerprint identification unit G21 with the light rays reflected through different parts of the touch body G4, and improving accuracy and precision for fingerprint identification.

Besides providing the angle-limiting film between the display module and the fingerprint identification module (as shown in FIG. 10a to FIG. 14b), the following manner may also be adopted to improve the fingerprint identification precision of the display apparatus: the plurality of organic light emitting units are controlled to emit light in a first light emitting lattice and shift. Fingerprint reflection light for any organic light emitting unit being illuminated in the first light emitting lattice will not be irradiated on the fingerprint identification unit associated with other organic light emitting units which simultaneously emit light. That is to say, the fingerprint identification unit associated with any organic light emitting unit in the first light emitting lattice can only receive the fingerprint reflection light of the organic light emitting unit associated therewith. Therefore, the fingerprint identification units will not receive crosstalk signals of other organic light emitting units. Accordingly, since the fingerprint identification circuit of the display apparatus performs fingerprint identification according to sensing signals generated by the fingerprint identification units, the fingerprint identification precision of the display apparatus can be improved.

Figure 15A:
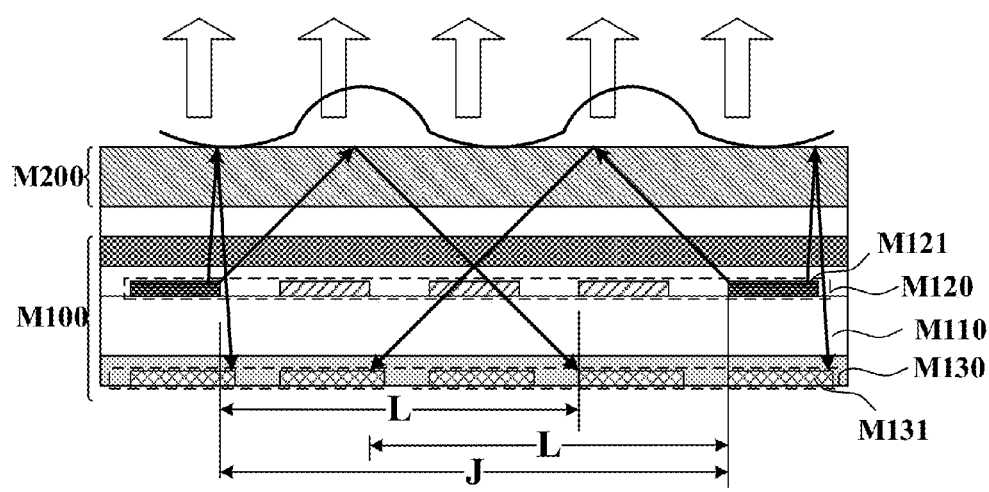
FIG. 15a is a schematic diagram illustrating a display apparatus provided by embodiments of the present disclosure.
Figure 15B:
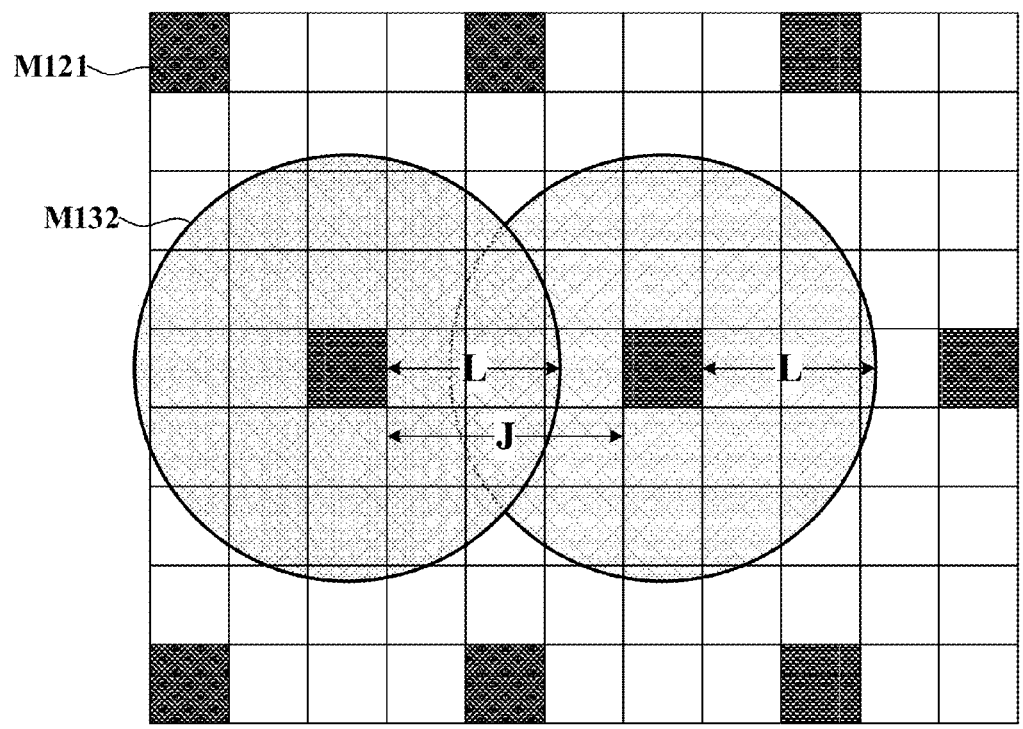
Figure 15C:
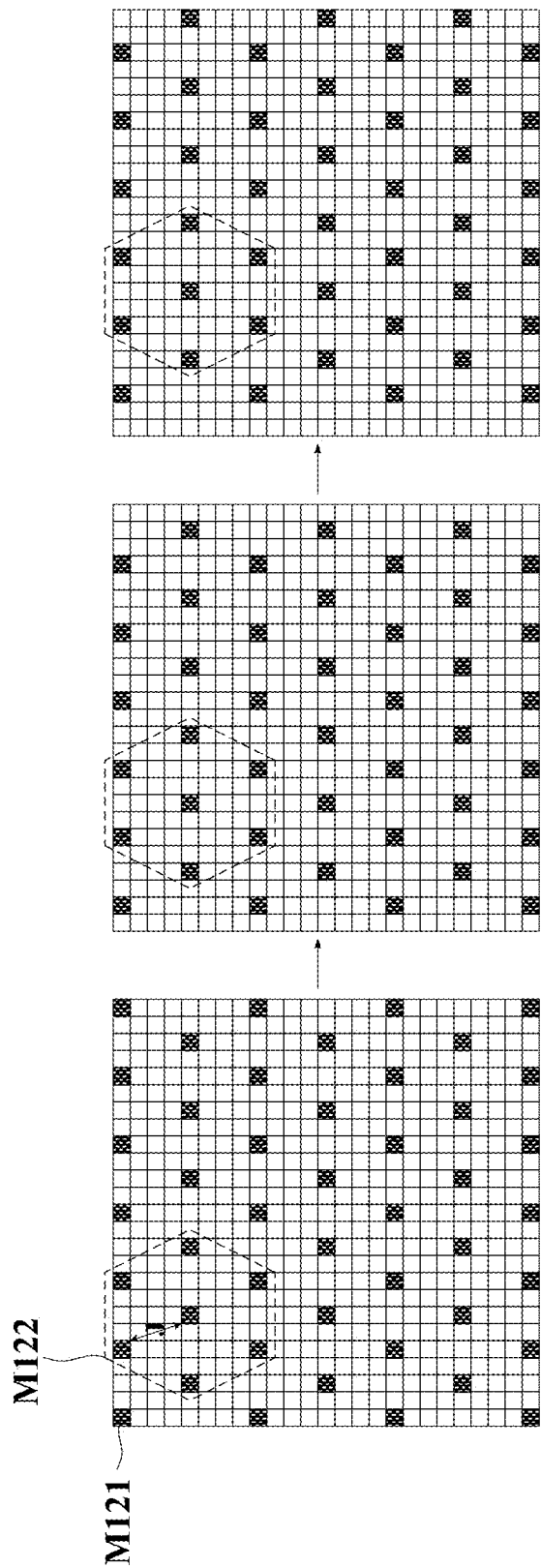

FIG. 15a is a schematic diagram illustrating a display apparatus provided by embodiments of the present disclosure. FIG. 15b is a local top view illustrating the display apparatus shown in FIG. 15a. FIG. 15c is a scanning schematic diagram illustrating a fingerprint identification phase of the display apparatus shown in FIG. 15a. The display apparatus provided by embodiments of the present disclosure includes: a display panel M100 and a cover plate M200 disposed on the display panel M100. The display panel M100 includes an array substrate M110, an organic light emitting layer M120 disposed at one side facing the cover plate M200 of the array substrate M110, and a fingerprint identification array M130. The organic light emitting layer M120 includes a plurality of organic light emitting units M121. The cover plate M200 has a first surface facing away from the array substrate M100, and the first surface is a light exiting surface of the display apparatus. In a fingerprint identification phase, the plurality of organic light emitting units M121 emit light in the first light emitting lattice M122 and shift. A distance J between any two adjacent organic light emitting units M121 in the first light emitting lattice M122 is greater than or equal to a minimum crosstalk-free distance L. The minimum crosstalk-free distance L is a maximum radius of a covering region M132 formed on the fingerprint identification array M130 by the light emitted from any organic light emitting unit M121 and then reflected by the first surface of the cover plate M200. In the present embodiment, the display apparatus is optionally an organic light emitting display apparatus. Optionally, the fingerprint identification array M130 is arranged at a side, facing away from the cover plate M200, of the array substrate M110. The fingerprint identification array M130 includes a plurality of fingerprint identification units M131. The plurality of fingerprint identification units M131 and the plurality of organic light emitting units M121 are correspondingly arranged.

Figure 16:
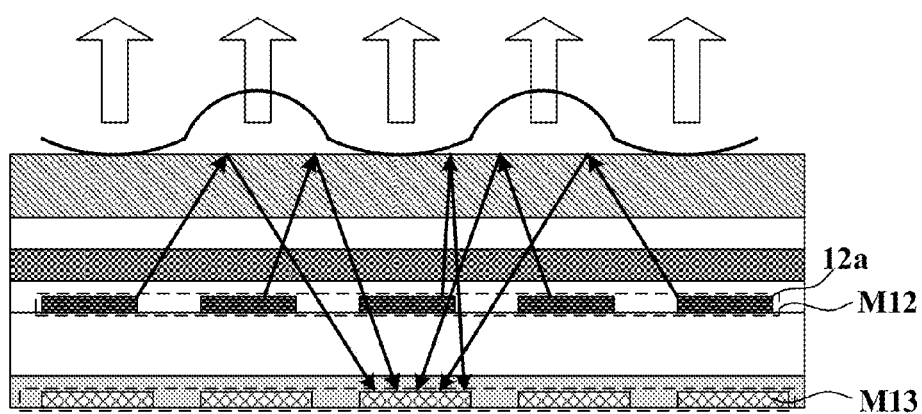
FIG. 16 is a schematic diagram illustrating crosstalk of a display apparatus provided by embodiments of the present disclosure.

The first light emitting lattice M122 serves as the detection light source for the fingerprint identification unit M131 because the light rays emitted from the organic light emitting units M121 have a wide range of angular distribution. As shown in FIG. 16, in the case that all the organic light emitting units M121 of the organic light emitting layer 12a are adopted by the display apparatus to simultaneously emit light for performing the fingerprint identification, besides the fingerprint reflection light from the associated organic light emitting unit 12a, each fingerprint identification unit M13 also receives crosstalk signals from other organic light emitting units 12a, causing low fingerprint identification precision.

In order to improve the fingerprint identification precision, in the fingerprint identification phase of the display apparatus provided by the present embodiment, a plurality of organic light emitting units M121 emit light in the first light emitting lattice M122 and shift, and a distance J between any two adjacent organic light emitting units M121 in the first light emitting lattice M122 is greater than or equal to the minimum crosstalk-free distance L. As shown in FIG. 15a and FIG. 15b, the light rays emitted from the organic light emitting units M121 have angular distribution, so a covering region M132 is formed on the fingerprint identification array M130 by the light emitted from the organic light emitting units M121 and reflected through the first surface of the cover plate M200. The fingerprint reflection light for the light emitted at any angle from the organic light emitting units M121 will fall into the covering region M132. The maximum radius of the covering region M132 is the minimum crosstalk-free distance L. In the present embodiment, since the distance J between any two adjacent organic light emitting units M121 in the first light emitting lattice M122 is greater than or equal to the minimum crosstalk-free distance L, the fingerprint reflection light for any organic light emitting unit M121 will not be irradiated on the fingerprint identification units M131 associated with other organic light emitting units M121 which simultaneously emit light. In other words, each fingerprint identification unit M131 associated with any one of the organic light emitting units M121 in the first light emitting lattice M122 can only receive the fingerprint reflection light from the organic light emitting unit M121 associated with the fingerprint identification unit. Therefore, in the display apparatus provided by the present embodiment, the fingerprint identification unit M131 will not receive the crosstalk signals from other organic light emitting units. Accordingly, the fingerprint identification circuit of the display apparatus performs fingerprint identification according to sensing signals generated by the fingerprint identification unit M131, thereby improving the fingerprint identification precision of the display apparatus.

It should be noted that the fingerprint reflection light is a reflection light generated by reflecting the light rays emitted from the organic light emitting unit M121 through the fingerprint of the user's finger pressed on the first surface of the cover plate M200. Since a distance between the fingerprint of the user's finger and the first surface of the cover plate M200 is very small compared with a thickness of the display apparatus, such distance has small influence on a scope of the covering region M132. Therefore, in the present embodiment, a reflection distance between the finger of the user and the first surface of the cover plate M200 is omitted in setting the minimum crosstalk-free distance L. In addition, the radius L of the covering region M132 should be substantially computed by taking the central point of the organic light emitting unit M121 as the origin. However, a large number of organic light emitting units M121 are arranged in the actual display apparatus. Accordingly, the size of the organic light emitting unit M121 is small. Therefore, in the present embodiment, the organic light emitting unit M121 can be integrally regarded as the origin of the covering region M132. In other words, the radius L of the covering region M132 indicates a length from an edge of the organic light emitting unit M121 to an edge of the covering region M132, and the size of the organic light emitting unit M121 is not counted into the minimum crosstalk-free distance L. It can be understood by those skilled in the art that, the minimum crosstalk-free distance L is related to factors such as the thickness of the display apparatus, a light exiting angle of the organic light emitting units and the like. Therefore, the minimum crosstalk-free distances L of different display apparatuses are different in numerical values. In other optional embodiments, the size of the organic light emitting unit is optionally counted into the minimum crosstalk-free distance L, which is not specifically limited in the present disclosure.

As mentioned above, the light rays emitted from the organic light emitting units M121 have angular distribution, and the minimum crosstalk-free distance L is the maximum radius of the covering region M132 formed on the fingerprint identification array M130 by the light emitted from any organic light emitting unit M121 and reflected by the first surface of the cover plate M200. Apparently, a region, defined by the reflection light for the light rays with a maximum angle emitted from the edge of the organic light emitting units M121, on the fingerprint identification array M130 is the covering region M132. Each reflection light for the light rays with any angle emitted from the organic light emitting units M121 falls into the covering region M132.

Figure 15D:
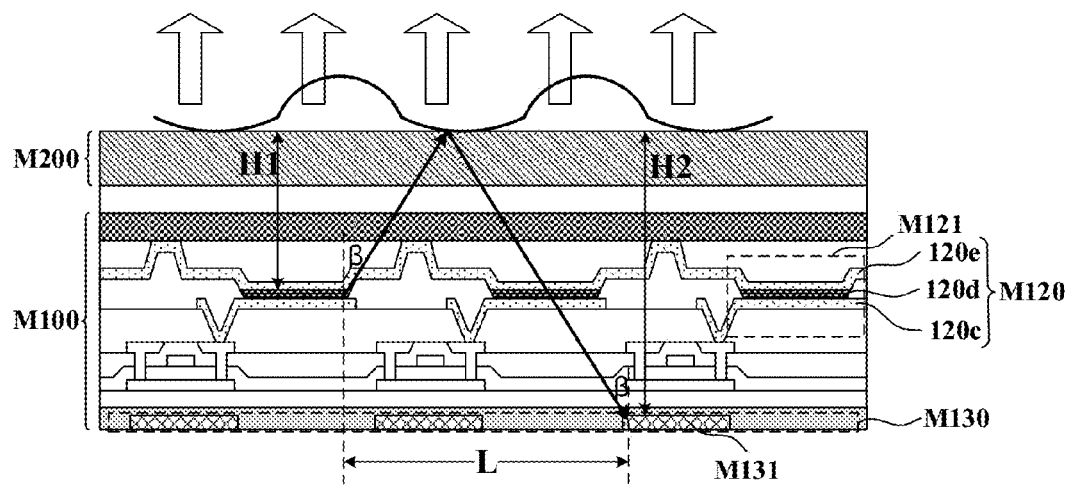

As shown in FIG. 15d, in embodiments of the present disclosure, the organic light emitting layer M120 includes a first electrode 120c, a light emitting functional layer 120d and a second electrode 120e arranged sequentially along a direction in which the organic light emitting units M121 are away from the array substrate M110. A first electrode 120c, a light emitting functional layer 120d arranged correspondingly to the first electrode 120c, and a second electrode 120e associated with the first electrode 120c form an organic light emitting unit. If the organic light emitting layer M120 includes organic light emitting units of three colors, each organic light emitting unit M121 includes organic light emitting units of three different colors. If signals are applied to the first electrode 120c and the second electrode 120e, the light emitting functional layer 120d emits light. The light rays emitted from the light emitting functional layer 120d have angular distribution. The fingerprint reflects the signals essentially through specular reflection. In other words, a reflection angle is equal to an incident angle. As can be known that L=tan $\beta$*H1+tan $\beta$*H2, where "L" is the minimum crosstalk-free distance; "$\beta$" is an included angle between a direction corresponding to a preset brightness of the organic light emitting units M121 and a direction vertical to the organic light emitting layer; "H1" is a height from the first surface of the cover plate M200 to the light emitting functional layer in the direction vertical to the display apparatus; "H2" is a height from the first surface of the cover plate M200 to the fingerprint identification array M130 in the direction vertical to the display apparatus; and the preset brightness is less than or equal to 10% of a brightness in the direction vertical to the organic light emitting layer.

In the present embodiment, an angle of the light rays emitted from the organic light emitting units M121 is related to the brightness of the organic light emitting units M121. The brightness is a subjective feeling for (decoloration) light emitting intensity. The brightness of the organic light emitting units M121 in the vertical direction is defined as 100% in the present embodiment. The lower the percentage of the brightness is, the larger the corresponding light exiting angle (an included angle between the direction of the light emitted and the direction vertical to the organic light emitting layer) is and the weaker the light emitting intensity is. When the brightness of the organic light emitting unit M121 is less than or equal to 10%, the light intensity of the light rays emitted from the organic light emitting unit M121 is very weak. Therefore, the reflection light generated on the first surface of the cover plate M200 by the light rays emitted from the organic light emitting unit M121 will not cause crosstalk to the fingerprint identification unit M131. Therefore, in the present embodiment, the light exiting angle of the organic light emitting unit M121 is set to have a critical value of 10% brightness. Based on this, β is determined as follows: measuring the brightness of the organic light emitting unit M121 in the vertical direction; determining a position corresponding to 10% of the brightness in the direction vertical to the organic light emitting layer; and determining β according to the included angle between the direction of the position and the direction vertical to the organic light emitting layer. It can be understood for those skilled in the art that the light intensities of the organic light emitting units of different display apparatuses may be different, and preset brightness values may also be different accordingly. For example, in other optional embodiments, the preset brightness value is optionally 12% or 9% and the like of the brightness in the direction vertical to the organic light emitting layer, which is not limited in the present disclosure.

FIG. 15c is a scanning schematic diagram of a display apparatus. In the phase of fingerprint identification, the display apparatus performs the fingerprint identification in a manner of screen scanning. Specifically, the organic light emitting units M121 are illuminated at the same time according to the first light emitting lattice M122, and the sensing signals generated by the fingerprint identification units M131 at positions associated with the illuminated organic light emitting units M121 are recorded. In a next screen, the organic light emitting units M121 illuminated at the same time shift and corresponding sensing signals are recorded until all the organic light emitting units M121 are illuminated circularly; and the fingerprint identification is performed based on the acquired sensing signals of each fingerprint identification unit M131. Since no crosstalk signal is received by the fingerprint identification unit M131 in the present embodiment, the fingerprint identification precision of the present embodiment is very high. It can be understood for those skilled in the art that the first light emitting lattice optionally is a minimum repeating unit formed by a plurality of organic light emitting units that emit light at the same time, and is not limited to a lattice formed by a plurality of organic light emitting units that emit light at the same time.

In the display apparatus provided by embodiments of the present disclosure, in the phase of fingerprint identification, a plurality of organic light emitting units emit light in the first light emitting lattice and shift. The distance between any two adjacent organic light emitting units in the first light emitting lattice is greater than or equal to the minimum crosstalk-free distance. The minimum crosstalk-free distance is the maximum radius of the covering region formed on the fingerprint identification array by the light emitted from any organic light emitting unit and reflected through the first surface of the cover plate. Apparently, the fingerprint reflection light of any organic light emitting unit in the first light emitting lattice will never be irradiated on the fingerprint identification units associated with other organic light emitting units that emit light simultaneously. In other words, each fingerprint identification unit only receives the fingerprint reflection light of the organic light emitting unit associated with the fingerprint identification unit in the first light emitting lattice. Therefore, no crosstalk signal from other organic light emitting units is received by each fingerprint identification unit. Accordingly, the fingerprint identification precision of the display apparatus is improved because the fingerprint identification is performed by the fingerprint identification circuit of the display apparatus based on sensing signals generated by the fingerprint identification units.

It should be noted that the display apparatus shown in FIG. 15a is only a structure of one display apparatus of the present disclosure. Various display apparatuses with different structures are further provided in other embodiments of the present disclosure.

Figure 17:
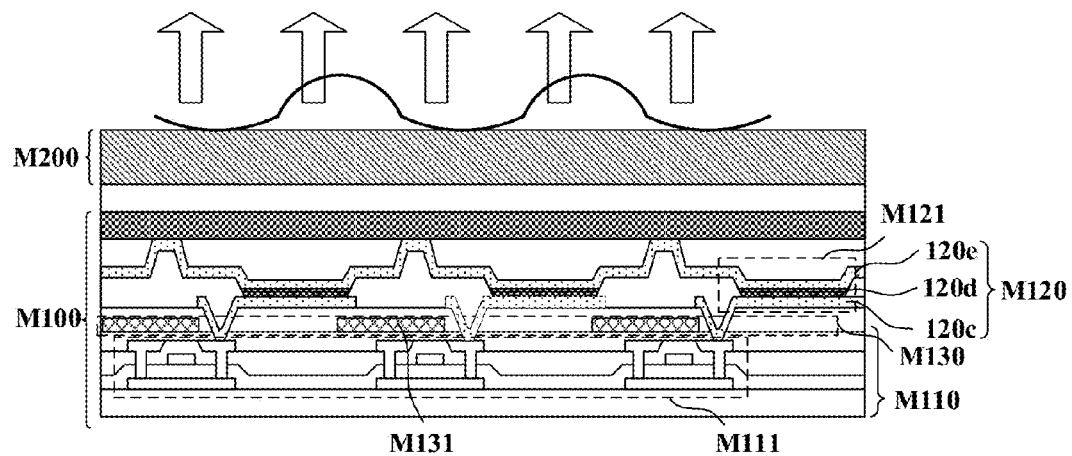
FIG. 17 is a schematic diagram illustrating a second display apparatus provided by embodiments of the present disclosure.

Embodiments of the present disclosure further provide a second type of display apparatus which is different from the display apparatus shown in FIG. 15a only in structures. Specifically, as shown in FIG. 17, in the display apparatus, a thin film transistor array M111, a fingerprint identification array M130 and an organic light emitting layer M120 are stacked at one side facing the cover plate M200 of the array substrate 110. As shown in FIG. 17, the fingerprint identification array M130 is arranged between the thin film transistor array M111 and the organic light emitting layer M120. The fingerprint identification array M130 and the thin film transistor array M111 are stacked and insulated from each other, and the fingerprint identification array M130 and the organic light emitting layer M120 are stacked and insulated from each other. The process of fingerprint identification of the display apparatus is similar to that of the display apparatus shown in FIG. 5a, and is not repeated herein. It should be noted that the fingerprint identification array M130 is arranged between the thin film transistor array M111 and the organic light emitting layer M120, and thus will not influence an aperture ratio of the first electrode in the organic light emitting units M121 in the organic light emitting layer M120. Therefore, an arrangement mode of the fingerprint identification units M131 in the fingerprint identification array M130 can be determined as required by products, and is not specifically limited in the present disclosure.

Figure 18A:
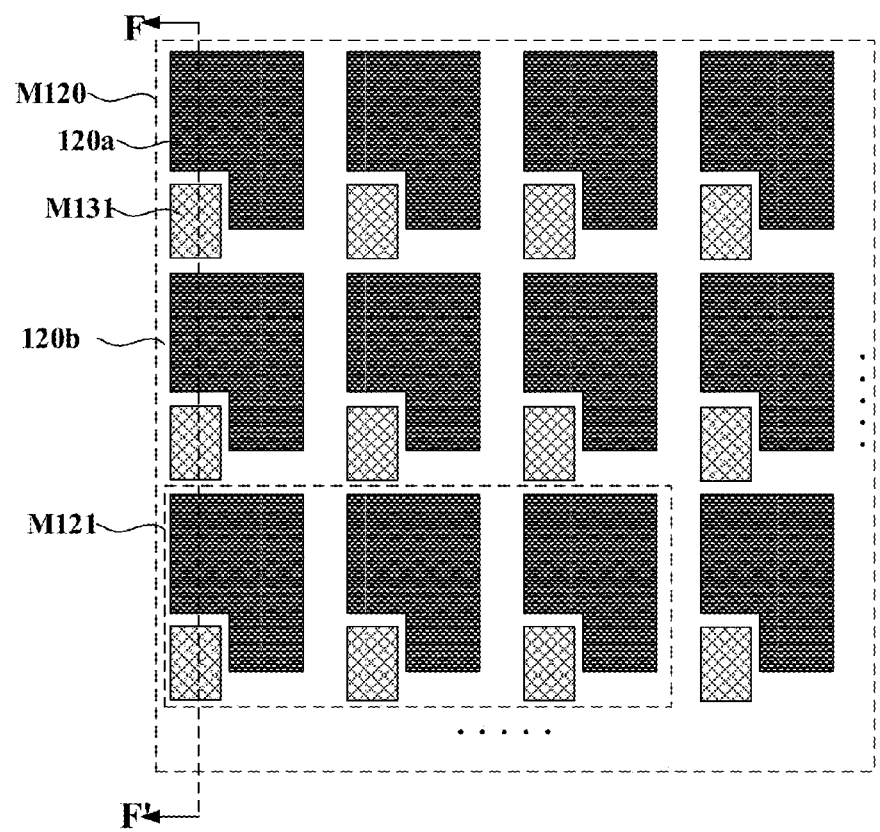
FIG. 18a is a schematic diagram illustrating a third display apparatus provided by embodiments of the present disclosure.
Figure 18B:
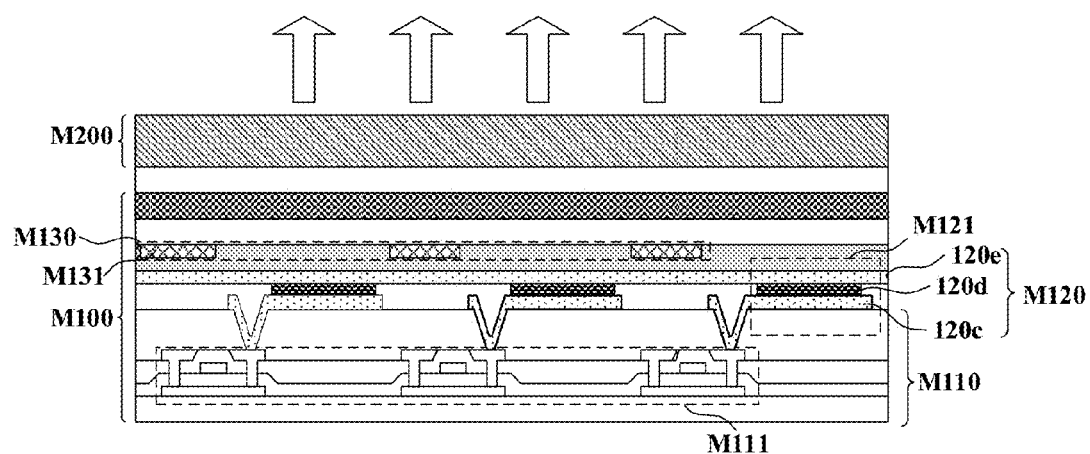

Embodiments of the present disclosure further provide a third type of display apparatus which is different from any of the above display apparatuses only in structures. Specifically, FIG. 18a is a top view of the display apparatus. FIG. 18b is a sectional view of FIG. 18 along line FF'. In the display apparatus shown in FIG. 18a to FIG. 18b, the thin film transistor array M111, the organic light emitting layer M120 and the fingerprint identification array M130 are stacked at a side facing the cover plate M200 of the array substrate M110. As shown in FIG. 18a, the organic light emitting layer M120 includes a display region 120a and a non-display region 120b. A projection of the fingerprint identification array M130 in the direction vertical to the display apparatus is within the non-display region 120b of the organic light emitting layer M120. As shown in FIG. 18a to FIG. 18b, the fingerprint identification array M130 is arranged on a surface of one side, facing the cover plate M200, of the organic light emitting layer M120. The fingerprint identification array M130 and the organic light emitting layer M120 are stacked and insulated from each other. The fingerprint identification process of the display apparatus is similar to that of the display apparatus shown in FIG. 15a, and is not repeated herein. It should be noted that the fingerprint identification array M130 is arranged on the surface of the side, facing the cover plate M200, of the organic light emitting layer M120. In order to avoid reducing the aperture ratio of the first electrode 120c in the organic light emitting units M121, projections of the fingerprint identification units M131 in the fingerprint identification array M130 in the direction vertical to the display apparatus are within the non-display region 120b of the organic light emitting layer M120.

Figure 19A:
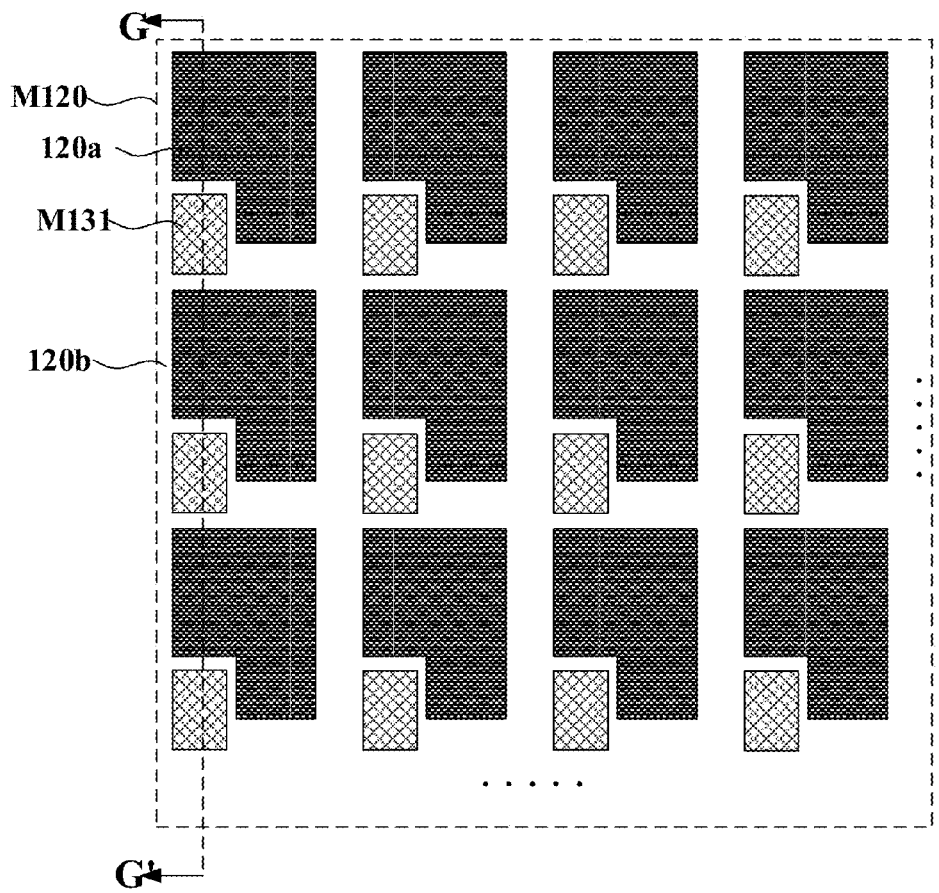
FIG. 19a is a schematic diagram illustrating a fourth display apparatus provided by embodiments of the present disclosure.
Figure 19B:
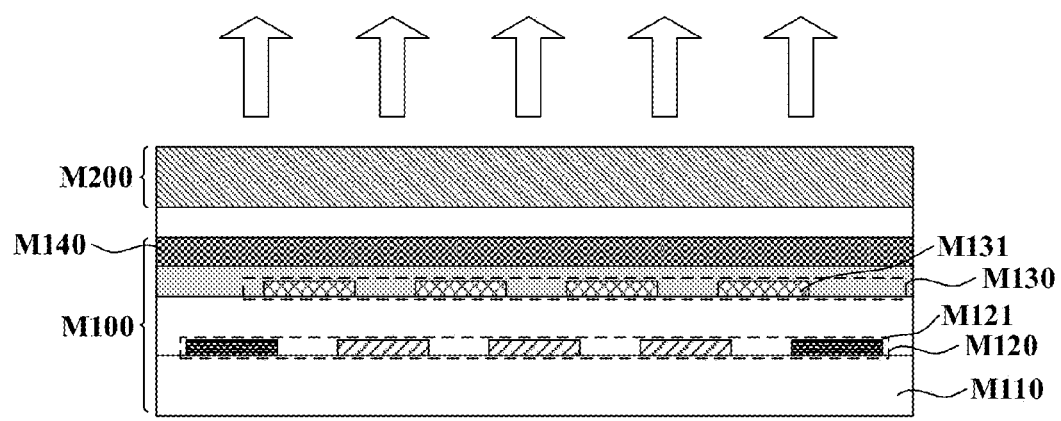

Embodiments of the present disclosure further provide a fourth type of display apparatus which is different from any of the above display apparatuses only in structures. Specifically, FIG. 19a is a top view of the display apparatus, and FIG. 19b is a sectional view of FIG. 19a along line GG'. In the display apparatus shown in FIG. 19a to FIG. 19b, the display panel M100 further includes an encapsulating glass M140 disposed at a side, facing the cover plate M200, of the array substrate M110. The organic light emitting layer M120 is arranged at the side, facing the cover plate M200, of the array substrate M110. The fingerprint identification array M130 is arranged at a side, facing the array substrate M110, of the encapsulating glass M140. The organic light emitting layer M120 includes a display region 120a and a non-display region 120b. The projection of the fingerprint identification array M130 in the direction vertical to the display apparatus is within the non-display region 120b of the organic light emitting layer M120. The display apparatus is encapsulated with the encapsulating glass M140. The fingerprint identification array M130 is arranged at a side, facing the array substrate M110, of the encapsulating glass M140, i.e., an inner side of the encapsulating glass M140. The fingerprint identification process of the display apparatus is similar to that of the display apparatus shown in FIG. 15a, and is not repeated herein. In order to avoid reducing the aperture ratio, the projections of the fingerprint identification units M131 in the fingerprint identification array M130 in the direction vertical to the display apparatus are within the non-display region 120b of the organic light emitting layer M120.

Figure 20A:
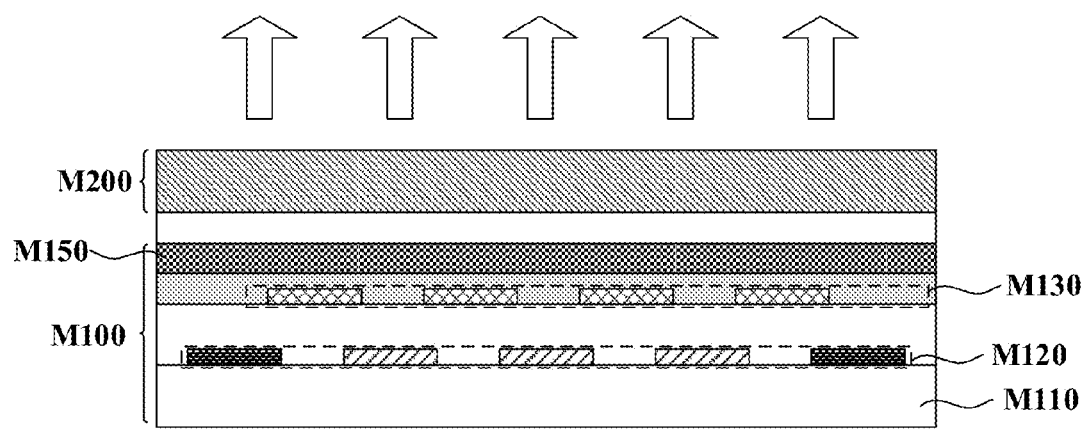
FIG. 20a to FIG. 20b are schematic diagrams illustrating two display apparatuses provided by embodiments of the present disclosure.
Figure 20B:
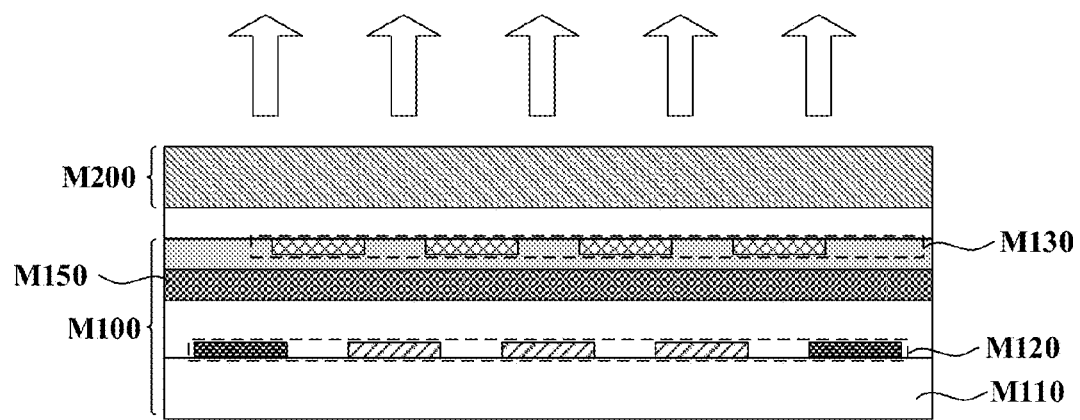
Figure 20C:
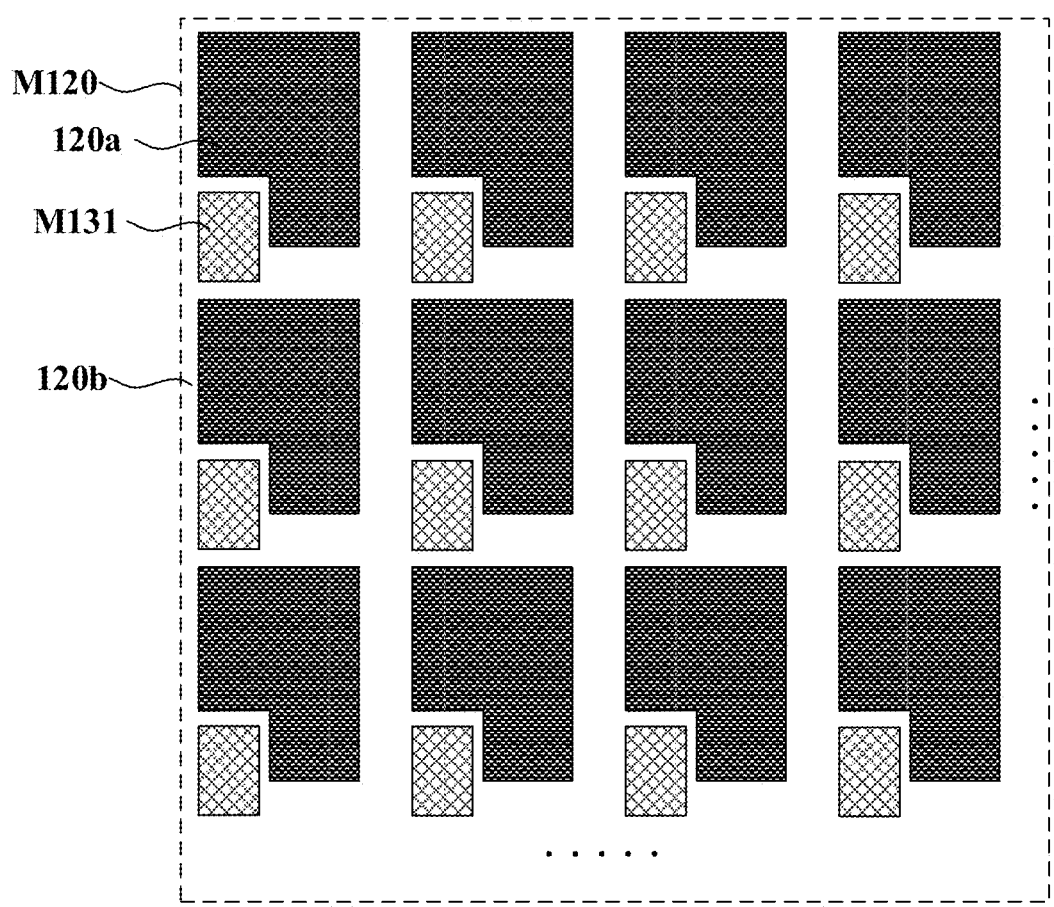
FIG. 20c is top view illustrating a display apparatus shown in FIG. 20a to FIG. 20b.

Embodiments of the present disclosure further provide two types of display apparatuses which are different from any of the above display apparatuses only in structures. Specifically, in the display apparatuses shown in FIG. 20a and FIG. 20b, the display panel M100 further includes a film encapsulating layer M150 disposed at a side, facing the cover plate M200, of the array substrate M110. The organic light emitting layer M120 is arranged at the side, facing the cover plate M200, of the array substrate M110. As shown in FIG. 20a, the fingerprint identification array M130 is arranged at a side, facing the array substrate M110, of the film encapsulating layer M150. As shown in FIG. 20b, the fingerprint identification array M130 is arranged at a side, facing away from the array substrate M110, of the film encapsulating layer M150. As shown in FIG. 20c, the organic light emitting layer M120 includes a display region 120a and a non-display region 120b. The projection of the fingerprint identification array M130 in the direction vertical to the display apparatus is within the non-display region 120b of the organic light emitting layer M120. The display apparatus is encapsulated with the film encapsulating layer M150. The fingerprint identification array M130 can be arranged at an inner side of the film encapsulating layer M150, and can also be arranged at an outer side of the film encapsulating layer M150. The fingerprint identification process of these display apparatuses is similar to that of the display apparatus shown in FIG. 15a, and is not repeated herein. In order to avoid reducing the aperture ratio, the projections of the fingerprint identification units M131 in the fingerprint identification array M130 in the direction vertical to the display apparatus are within the non-display region 120b of the organic light emitting layer M120.

Figure 21A:
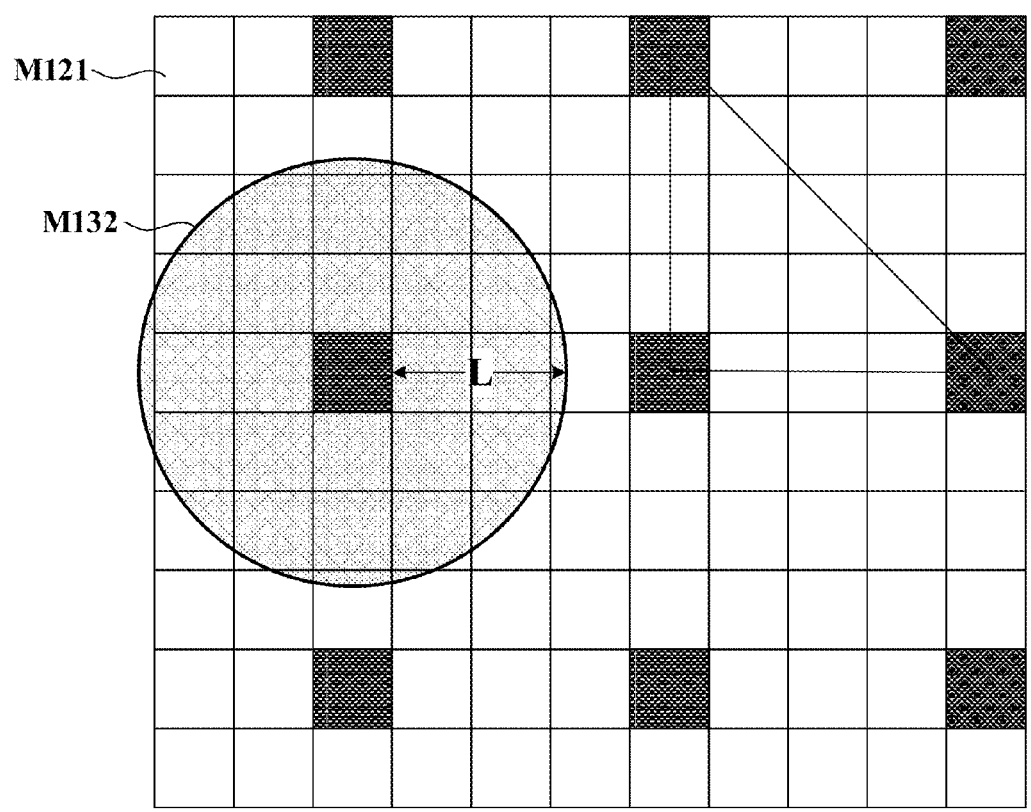
FIG. 21a to FIG. 21b are schematic diagrams illustrating scanning of a fingerprint identification phase of two display apparatuses provided in another embodiment of the present disclosure.

It should be noted that fingerprint information is read by the display apparatus in the manner of screen scanning. In one frame, the organic light emitting units M121 are controlled to emit light according to the first light emitting lattice M122, and the fingerprint signals from the fingerprint identification units M131 associated with the organic light emitting units M121 which emit light are collected. In a next frame, the organic light emitting units M121 which emit light shift. The organic light emitting units M121 which emit light shift successively, until all the organic light emitting units M121 are illuminated through multiple frames. Apparently, the fingerprint information is read by the display apparatus through multiple frames. The smaller the number of the organic light emitting units M121 being illuminated in the one-frame picture is, the more the number of frames required for the reading of the fingerprint information is, and the longer the time required for reading the fingerprint information is. For example, assuming that the fingerprint information is read by the display apparatus in the manner of screen scanning shown in FIG. 21a, and the number of the organic light emitting units M121 which emit light simultaneously in the one frame (11*10 organic light emitting units) is 9. In this case, at least 12 frames need to be scanned to complete the reading of the fingerprint information from the fingerprint identification units M131 for all the organic light emitting units M121, and the time for reading the fingerprint information for each frame is constant.

Figure 21B:
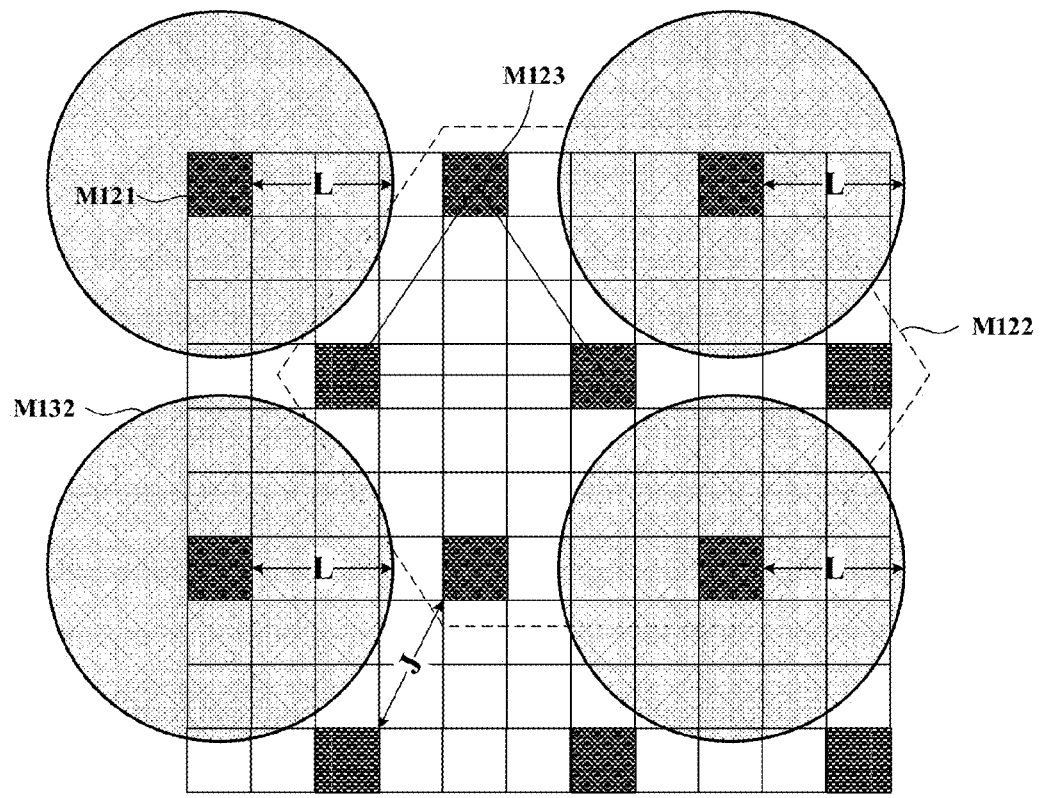

To reduce the time required for reading the fingerprint, optionally, as shown in FIG. 21b, the plurality of organic light emitting units M121 of the first light emitting lattice M122 form a plurality of patterns. As shown in FIG. 21b, an angle of each corner of pattern M123 with a minimum area among the plurality of patterns is not equal to 90°. Apparently, compared with FIG. 21a, the distance J between any two adjacent organic light emitting units M121 emitting light in the first light emitting lattice M122 is reduced. Accordingly, the number of the organic light emitting units M121 illuminated in the one frame is larger. Specifically, the number of the organic light emitting units M121 emitting light simultaneously in one frame (11*10 organic light emitting units) is 12, so at most 10 frames need to be scanned to complete the reading of the fingerprint information from the fingerprint identification units M131 for all the organic light emitting units M121. By forming a plurality of patterns with the plurality of organic light emitting units M121 in the first light emitting lattice M122 and setting the angle of each corner of the pattern M123 with a minimum area among the plurality of patterns to be not equal to 90°, the number of the organic light emitting units M121 illuminated simultaneously is increased while no signal crosstalk is ensured, so as to significantly reduce the time required for reading the fingerprint.

Figure 22A:
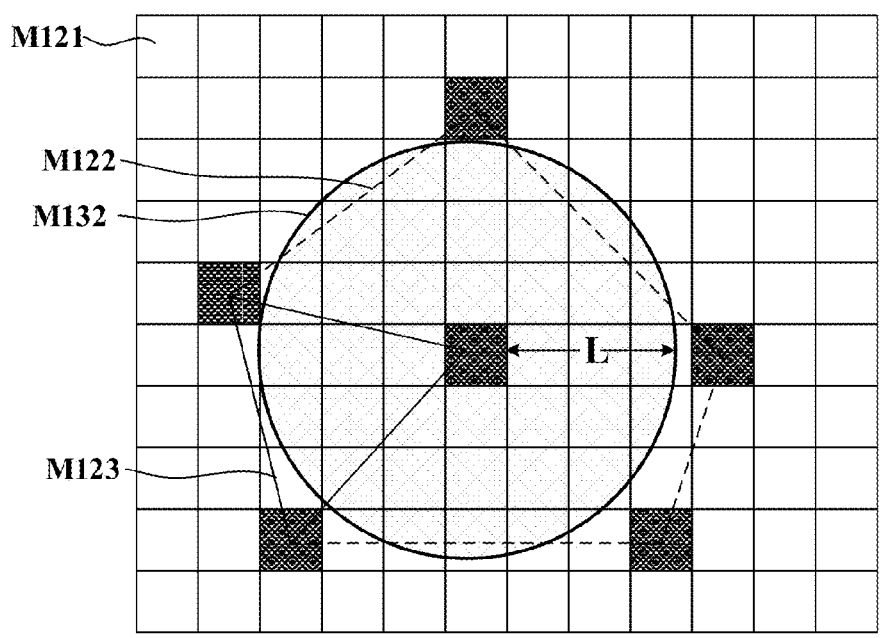
FIG. 22a to FIG. 22c are schematic diagrams illustrating three types of a first light emitting lattice provided in another embodiment of the present disclosure.

Exemplarily, based on the display apparatuses described in any of above embodiments, optionally, the first light emitting lattice M122 is a pentagonal light emitting lattice including a central organic light emitting unit M121 and five marginal organic light emitting units M121, as shown in FIG. 22a. The organic light emitting units M121 of the first light emitting lattice M122 form a plurality of patterns, and an angle of each corner of pattern M123 with a minimum area among the plurality of patterns is not equal to 90°. The pentagonal light emitting lattice can increase the number of the organic light emitting units M121 illuminated simultaneously while ensuring no signal crosstalk, thereby reducing the time required for reading the fingerprint.

Figure 22B:
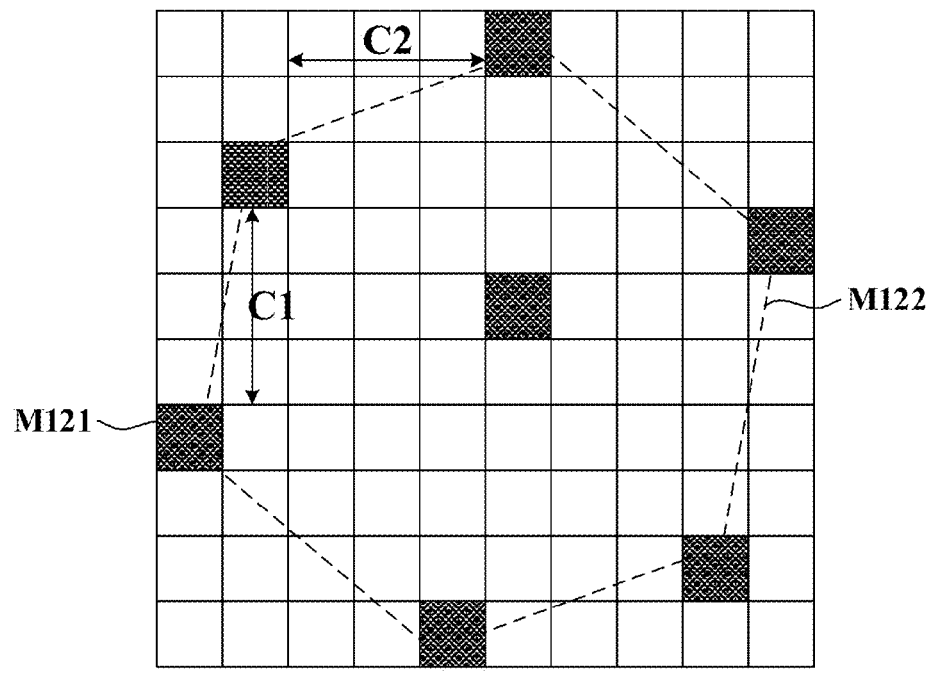

Exemplarily, based on the display apparatuses described in any of above embodiments, optionally, the first light emitting lattice M122 is a hexagonal light emitting lattice including a central organic light emitting unit M121 and six marginal organic light emitting units M121, as shown in FIG. 22b. The hexagonal light emitting lattice can increase the number of the organic light emitting units M121 illuminated simultaneously while ensuring no signal crosstalk, thereby reducing the time required for reading the fingerprint.

Figure 22C:
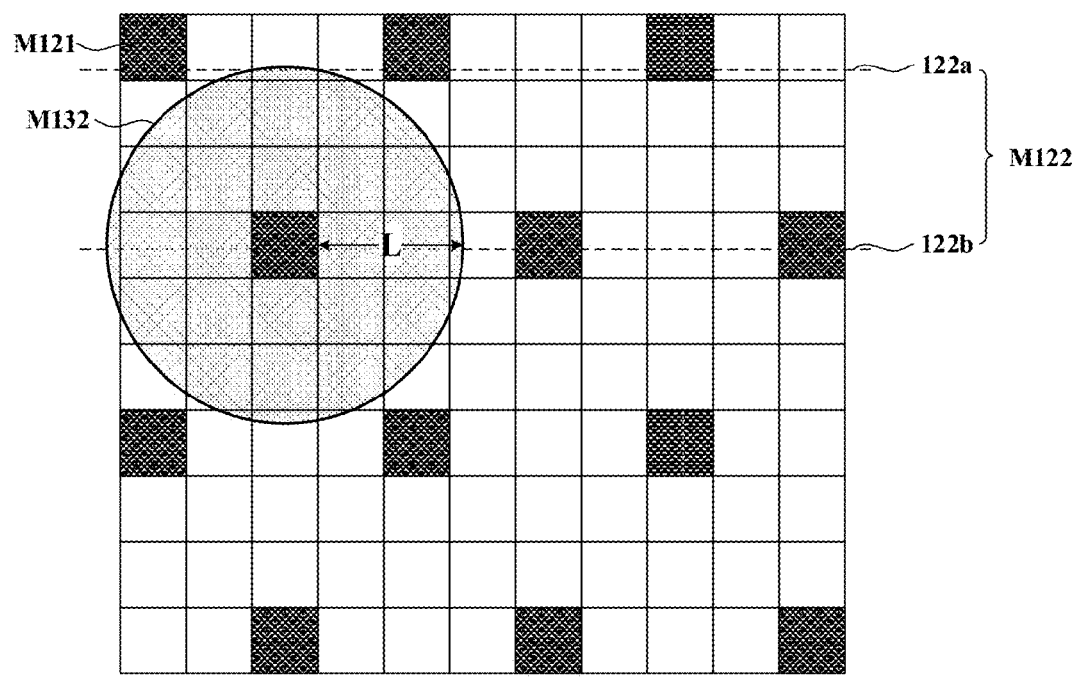

Exemplarily, based on the display apparatuses described in any of above embodiments, the first light emitting lattice M122 optionally includes first light emitting rows 122a and second light emitting rows 122b alternately arranged, and any organic light emitting unit M121 in the first light emitting rows 122a and any organic light emitting unit M121 in the second light emitting rows 122b are arranged in different columns, as shown in FIG. 22c. Compared with the scanning mode shown in FIG. 21a, by arranging any organic light emitting unit M121 in the first light emitting rows 122a and any organic light emitting unit M121 in the second light emitting rows 122b in different columns, the number of the organic light emitting units M121 illuminated simultaneously is increased while ensuring no signal crosstalk. In FIG. 22c, the number of the organic light emitting units M121 emitting light simultaneously in one frame (11*10 organic light emitting units) is 12, so at most 10 frames need to be scanned to complete the reading of the fingerprint information from the fingerprint identification units M131 for all the organic light emitting units M121, thereby significantly reducing the time required for reading the fingerprint.

Optionally, for any type of first light emitting lattice M122 provided by any of above embodiments, the distance J between any two adjacent organic light emitting units M121 in the first light emitting lattice M122 is equal to the minimum crosstalk-free distance L. Apparently, the fingerprint identification unit M131 associated with one of the organic light emitting unit M121 emitting light in the first light emitting lattice M122 will not receive crosstalk signals from other organic light emitting units which emit light at the same time, thereby ensuring the accuracy of the fingerprint signal. Meanwhile, the distance J between any two adjacent organic light emitting units M121 in the first light emitting lattice M122 is equal to the minimum crosstalk-free distance L, thereby also increasing the number of the organic light emitting units M121 illuminated at the same time, reducing the time required for reading the fingerprint signal and improving fingerprint reading efficiency.

Optionally, in any type of first light emitting lattice M122 provided by any of above embodiments, for any two adjacent organic light emitting units M121 located in different rows in the first light emitting lattice M122, a vertical distance C1 (shown in FIG. 22b) from one of the two adjacent organic light emitting units M121 to the row in which the other organic light emitting unit M121 is located is smaller than the minimum crosstalk-free distance L; and/or for any two adjacent organic light emitting units M121 located in different columns in the first light emitting lattice M122, a vertical distance C2 (shown in FIG. 22b) from one of the two adjacent organic light emitting units M121 to the column in which the other organic light emitting unit M121 is located is smaller than the minimum crosstalk-free distance L. Such first light emitting lattice M122 ensures that the fingerprint identification unit M131 associated with the organic light emitting unit M121 emitting light will not receive crosstalk signals from other organic light emitting units emitting light simultaneously, thereby improving the fingerprint identification precision. Meanwhile, with such first light emitting lattice M122, the number of the organic light emitting units M121 illuminated at the same time can also be increased, the time required for reading the fingerprint signal is reduced and the fingerprint reading efficiency is improved.

Herein, to describe the fingerprint reading efficiency of the display apparatus provided by embodiments of the present disclosure more clearly, a square array scanning mode and an orthohexagonal array scanning mode are taken as examples to describe the fingerprint reading efficiency of the display apparatus provided by embodiments of the present disclosure. The crosstalk can be avoided only if the distance between adjacent illuminated organic light emitting units M121 in a screen being scanned is set to be at least 20 organic light emitting units 121 (a distance between centers of two organic light emitting units). Specifically, the size of each of the 20 organic light emitting units M121 is 20 P.

Figure 23A:
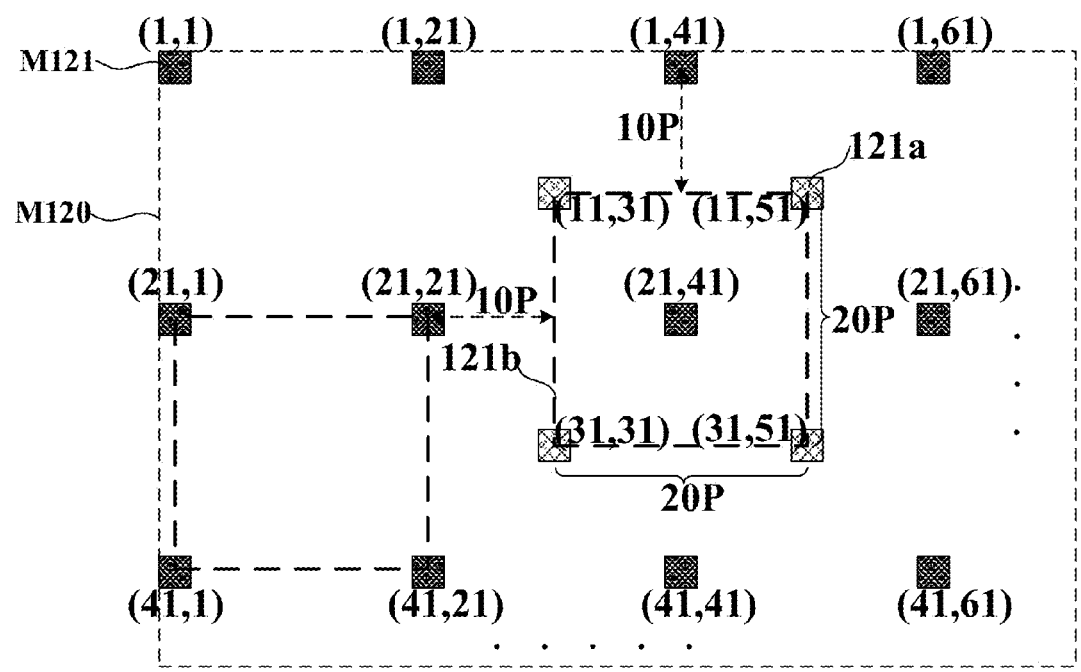
FIG. 23a is a schematic diagram illustrating a scanning mode of a square array of a display apparatus.

As for the square array scanning mode shown in FIG. 23a, coordinates of the illuminated organic light emitting units M121 are set as (row, column), and the coordinate of the first organic light emitting unit M121 in an upper left corner is set as (1, 1). As can be seen, coordinates of the illuminated organic light emitting units M121 in the first row are successively set as (1,1), (1,21), (1,41) . . . ; coordinates of the illuminated organic light emitting units M121 in the second row are successively set as (21,1), (21,21), (21,41) . . . ; coordinates of the illuminated organic light emitting units M121 in the third row are successively set as (41,1), (41,21), (41,41) . . . , and so on, thereby forming the coordinates of all the organic light emitting units M121 illuminated at the same time in one frame. The organic light emitting layer M120 of the display apparatus is divided transversely and longitudinally by having each illuminated organic light emitting unit M121 as a central point. As a result, the organic light emitting layer M120 is divided into a plurality of identical bright regions 121b. The sizes of all the bright regions 121b are completely the same. Each bright region 121b includes one illuminated organic light emitting unit M121 and a plurality of non-illuminated organic light emitting units 121a encircling the illuminated organic light emitting unit M121. It should be noted that an associated region of the illuminated organic light emitting unit M121, located at the edge of the organic light emitting layer M120, in the organic light emitting layer M120 is only a part of the bright region for the organic light emitting unit M121.

Taking the illuminated organic light emitting unit M121 (21,41) as an example, the bright region 121b associated with the illuminated organic light emitting unit M121 (21, 41) is encircled by four non-illuminated organic light emitting units 121a. The coordinates of the four non-illuminated organic light emitting units 121a are (11,31), (11,51), (31, 31) and (31,51) respectively. Apparently, a length and a width of the bright region 121b are both 20 P. In other words, the number of the organic light emitting units forming the bright region 121b is 20*20=400. There is only one illuminated organic light emitting unit (21,41) in the bright region 121b, that is, one organic light emitting unit M121 is illuminated in every 400 organic light emitting units M121. Therefore, a density of the illuminated organic light emitting units in the bright region 121b is 1/400. Since the organic light emitting layer M120 is divided into a plurality of bright regions 121b, a density of the illuminated organic light emitting units M121 in one frame is 1/400. As can be seen, 20*20=400 frames need to be scanned to illuminate all the organic light emitting units M121 in the display apparatus. FIG. 23a only shows some organic light emitting units M121 illuminated at the same time and coordinates thereof, and non-illuminated organic light emitting units 121a at four vertexes of one bright region 121b and coordinates thereof.

As for the hexagonal array scanning mode shown in FIG. 23b, coordinates of the illuminated organic light emitting units M121 are set as (row, column), and the coordinate of the first organic light emitting unit M121 in the upper left corner is set as (1, 1). In the orthohexagonal array, the distance J between any two adjacent illuminated organic light emitting units M121 reaches 20 organic light emitting units M121 (20 P), a distance J1 from the marginal organic light emitting unit M121 located in different rows from the central organic light emitting unit M121 to the row, in which the central organic light emitting unit M121 is located, shall reach 10 P$\sqrt{3}$≈18 P, and a distance J2 from the marginal organic light emitting unit M121 located in different rows from the central organic light emitting unit M121 to the column, in which the central organic light emitting unit M121 is located, shall reach 10 P$\sqrt{3}$≈18 P. As can be seen, coordinates of the illuminated organic light emitting units M121 in the first row are successively set as (1,1), (1,21), (1,41) . . . ; coordinates of the illuminated organic light emitting units M121 in the second row are successively set as (19,11), (19,31), (19,51) . . . ; coordinates of the illuminated organic light emitting units M121 in the third row are successively set as (37,1), (37,21), (37,41) . . . , and so on, thereby forming the coordinates of all the organic light emitting units M121 illuminated at the same time in one frame. Apparently, when the organic light emitting units M121 are illuminated, a row spacing between illuminated organic light emitting units M121 in different rows is reduced from 20 P to 18 P if a spacing between adjacent illuminated organic light emitting units M121 in each row is still 20 P. At this moment, the distance between the marginal organic light emitting unit M121 located in different rows from the central organic light emitting unit M121 and the central organic light emitting unit M121 is $\sqrt{(10P)^2+(18P)^2}$≈20.59 P>20 P, which can meet the requirements for avoiding crosstalk.

The organic light emitting layer M120 of the display apparatus is divided transversely and longitudinally by having each illuminated organic light emitting unit M121 as the central point. As a result, the organic light emitting layer M120 is divided into a plurality of identical bright regions 121b. Sizes of all the bright regions 121b are completely the same. Each bright region 121b includes one illuminated organic light emitting unit M121 and a plurality of non-illuminated organic light emitting units 121a encircling the illuminated organic light emitting unit M121. It should be noted that an associated region of the illuminated organic light emitting unit M121, located at the edge of the organic light emitting layer M120, in the organic light emitting layer M120 is only part of the bright regions.

Taking the illuminated organic light emitting unit M121 (19, 51) as an example, the bright region 121b associated with the illuminated organic light emitting unit M121 (19, 51) is encircled by four non-illuminated organic light emitting units 121a. The coordinates of the four non-illuminated organic light emitting units 121a are (10, 41), (10, 61), (28, 41) and (28, 61) respectively. Apparently, the size of the bright region 121b in the row direction is 20 P, and the size in the column direction is 18 P. In other words, the number of the organic light emitting units forming the bright region 121b is 20*18=360. There is only one illuminated organic light emitting unit (19, 51) in the bright region 121b. That is to say, one organic light emitting unit M121 is illuminated in every 360 organic light emitting units M121. Therefore, a density of the illuminated organic light emitting units in the bright region 121b is 1/360. Since the organic light emitting layer M120 is divided into a plurality of bright regions 121b, a density of the illuminated organic light emitting units M121 in one frame is 1/360. As can be seen, 20*18=360 frames need to be scanned to illuminate all the organic light emitting units M121 in the display apparatus. FIG. 23b only shows some organic light emitting units M121 illuminated at the same time and coordinates thereof, and non-illuminated organic light emitting units 121a at four vertexes of one bright region 121b and coordinates thereof.

Apparently, the hexagonal array scanning mode shown in FIG. 23b is better than the square array scanning mode shown in FIG. 23a.

Another embodiment of the present disclosure further provides a fingerprint identification method of a display apparatus. The display apparatus may be the display apparatus shown in above FIG. 15a to FIG. 15d and FIG. 17 to FIG. 22c, and includes: the display panel M100 and the cover plate M200 disposed on the display panel M100. The display panel M100 includes the array substrate M110, the organic light emitting layer M120 disposed at the side, facing the cover plate M200, of the array substrate M110, and the fingerprint identification array M130. The organic light emitting layer M120 includes a plurality of organic light emitting units M121. The first surface, facing away from the array substrate M100, of the cover plate M200 is the light exiting surface of the display apparatus. As shown in FIG. 24, the fingerprint identification method provided by the present embodiment includes steps described below.

In step M310, in the fingerprint identification phase, each organic light emitting unit in the organic light emitting layer is controlled to emit light according to the first light emitting lattice and shift, where the distance between any two adjacent organic light emitting units in the first light emitting lattice is greater than or equal to a minimum crosstalk-free distance. The minimum crosstalk-free distance is a maximum radius of a covering region formed on the fingerprint identification array by the light emitted from any organic light emitting unit and reflected through the first surface of the cover plate.

In step M320, the fingerprint identification is performed by the fingerprint identification array according to the light ray reflected on each of the fingerprint identification units by a touch body on the first surface of the cover plate. Optionally, the touch body in the present embodiment is the user's finger.

In the fingerprint identification method of the present embodiment performed by the display apparatus in a manner of screen scanning, each of the organic light emitting units in one screen emits light according to the first light emitting lattice and shifts. Since the distance between any two adjacent organic light emitting units in the first light emitting lattice is greater than or equal to the minimum crosstalk-free distance, the fingerprint reflection light formed by reflecting the light ray emitted from any organic light emitting unit in the first light emitting lattice with the fingerprint of the finger of the user will not be irradiated on the fingerprint identification units associated with other organic light emitting units in the lattice. Therefore, each fingerprint identification unit can only receive the fingerprint reflection light formed by the light ray emitted from the organic light emitting unit associated with the fingerprint identification unit in the first light emitting lattice. Namely, the fingerprint identification unit will not receive crosstalk signals from other organic light emitting units. Accordingly, the sensing signals generated by the fingerprint identification unit accurately indicates the reflection of the light ray emitted from the associated organic light emitting unit on the fingerprint of the user's finger. Therefore, the display apparatus provided by the present embodiment improves the fingerprint identification precision.

It should be noted that described embodiments are some embodiments of the present disclosure, not all of the embodiments. Those skilled in the art can combine above embodiments according to specific actual demands in order to achieve a purpose of improving the fingerprint identification accuracy. For example, in an embodiment, the reflective electrode of the organic light emitting unit as the light source is extended, and meanwhile, the second polarizer is arranged in the fingerprint identification module to prevent stray light from being irradiated on the fingerprint identification unit and weakening the intensity of the stray light irradiated on the fingerprint identification unit. In addition, to prevent the signal crosstalk existed in the fingerprint identification process, the angle-limiting film is arranged between the display panel and the fingerprint identification module, and meanwhile, a plurality of organic light emitting units are controlled to emit light according to the first light emitting lattice and shift.

Figure 25:
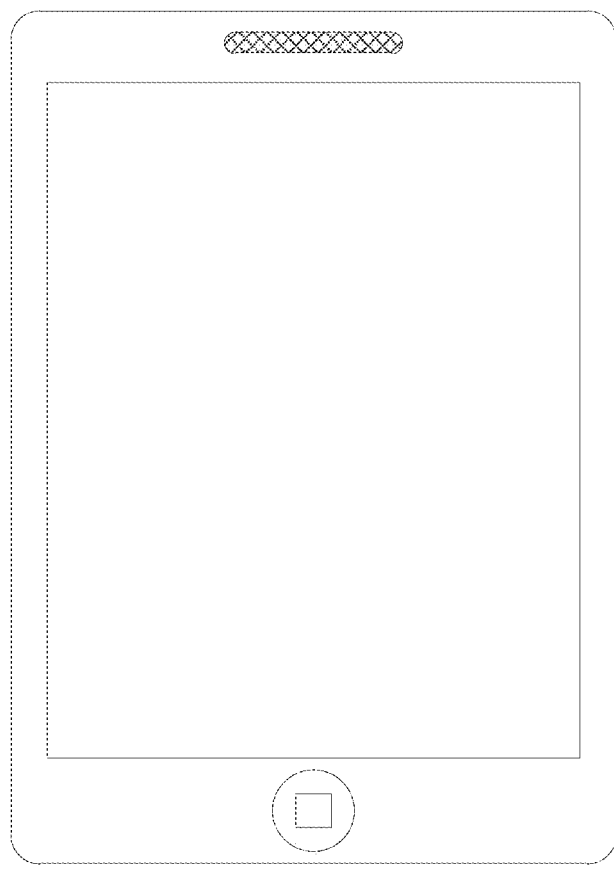
FIG. 25 is a schematic diagram illustrating an electronic device provided by embodiments of the present disclosure.

FIG. 25 is a structural schematic diagram illustrating an electronic device provided by embodiments of the present disclosure. As shown in FIG. 25, the electronic device includes any display panel or display apparatus provided in any embodiment described above. The electronic device is optionally a mobile phone, a tablet computer, a wearable device and the like in the present embodiment. The electronic device has a fingerprint identification function. Optionally, the electronic device may have a touch function in other optional embodiments.

It shall be noted that the above contents are only preferred embodiments of the present disclosure and used technical principles. It can be understood for those skilled in the art that the present disclosure is not limited to specific embodiments described herein. For those skilled in the art, the present disclosure can be subject to various apparent variations, readjustments and replacements without departing from a protection scope of the present disclosure. Therefore, although the present disclosure is described in detail through above embodiments, the present disclosure is not only limited to above embodiments. The present disclosure can also include more other equivalent embodiments without deviating from conceptions of the present disclosure. A scope of the present disclosure is determined by a scope of attached claims.

What is claimed is:

1. A display panel, comprising:
    an array substrate;
    a plurality of organic light emitting units disposed on the array substrate; and
    at least one fingerprint identification unit located in a display region at a side, close to the array substrate, of the plurality of organic light emitting unit,
    wherein the at least one fingerprint identification unit is configured to perform fingerprint identification according to light rays reflected on the at least one fingerprint identification unit by a touch body;
    wherein the plurality of organic light emitting units each comprise a red organic light emitting unit, a green organic light emitting unit and a blue organic light emitting unit; wherein at least one of the red organic light emitting unit and the green organic light emitting unit emits light in a fingerprint identification phase, and serves as a light source for the fingerprint identification unit; and
    wherein compared with the blue organic light emitting unit, at least one of the red organic light emitting unit and the green organic light emitting unit serving as the light source for the fingerprint identification unit has a smaller transparent area towards a side opposite to a display side of the display panel.

2. The display panel according to claim 1, further comprising a first substrate arranged at a side, facing away from the organic light emitting units of the array substrate, wherein the at least one fingerprint identification unit is arranged between the array substrate and the first substrate.

3. The display panel according to claim 1, wherein the array substrate comprises a second substrate and a plurality of pixel driving circuits disposed on the second substrate, wherein the plurality of pixel driving circuits each are electrically connected with an associated one of the organic light emitting units and
    wherein the at least one fingerprint identification unit is arranged between the second substrate and the organic light emitting units.

4. The display panel according to claim 3, wherein, compared with a vertical projection on the second substrate for the pixel driving circuit associated with the organic light emitting unit not serving as the light source for the fingerprint identification unit, a vertical projection on the second substrate for the pixel driving circuit associated with the organic light emitting unit serving as the light source for the fingerprint identification unit has a larger area; and
    wherein the at least one fingerprint identification unit is arranged between the plurality of pixel driving circuits and the second substrate.

5. The display panel according to claim 4, wherein the plurality of pixel driving circuits each comprise a data line, a scanning line and a capacitor metal plate.

6. The display panel according to claim 1, wherein the plurality of organic light emitting units each comprise a first electrode, a light emitting functional layer and a second electrode sequentially along a direction in which the organic light emitting units are away from the array substrate,
    wherein the first electrode is a reflective electrode; and
    compared with the first electrode of the blue organic light emitting unit, either one of the first electrode of the red organic light emitting unit and the green organic light emitting unit serving as the light source for the fingerprint identification unit has a larger area.

7. The display panel according to claim 6, wherein
    an area ratio of the first electrode of the organic light emitting unit serving as the light source for the fingerprint identification unit to the light emitting functional layer is in a range of 1.2 to 6 and
    an area ratio of the first electrode of the organic light emitting unit not serving as the light source for the fingerprint identification unit to the light emitting functional layer is in a range of 1 to 1.2.

8. The display panel according to claim 6, wherein, for the organic light emitting unit serving as the light source for the fingerprint identification unit, a vertical projection, on the array substrate, of a border of the first electrode of forms a first closed coil, and a vertical projection, on the array substrate, of a border of the light emitting functional layer forms a second closed coil; wherein the second closed coil is encircled by the first closed coil; wherein a shortest distance exists between any point on the first closed coil and an associated point on the second closed coil; wherein a range of the distance between the first closed coil and the second closed coil is a set of the shortest distances for all points on the first closed coil; and wherein the distance between the first closed coil and the second closed coil is in a range of 3 µm to 30 µm.

9. The display panel according to claim 6, wherein the light emitting functional layer of the blue organic light emitting unit has a larger area than the light emitting functional layer of the red organic light emitting unit or the green organic light emitting unit.

10. The display panel according to claim 1, wherein the array substrate further comprises a plurality of shading pads arranged between the organic light emitting units serving as the light sources of the fingerprint identification unit and the fingerprint identification unit;
wherein the plurality of organic light emitting units each comprise a first electrode, a light emitting functional layer and a second electrode sequentially along a direction in which the organic light emitting units are away from the array substrate, wherein the first electrode is a reflective electrode; and
wherein compared with a vertical projection area, on the array substrate, of the first electrode of the organic light emitting unit not serving as the light source of the fingerprint identification unit, a combined vertical projection area, on the array substrate, of the first electrode of the organic light emitting configuration serving as the light source of the fingerprint identification unit and the shading pad is larger.

11. The display panel according to claim 10, wherein a vertical projection, on the array substrate, of the border of the first electrode of the organic light emitting unit serving as the light source for the fingerprint identification unit is located in a vertical projection, on the array substrate, of the shading pad.

12. The display panel according to claim 10, wherein the array substrate comprises a second substrate and a plurality of pixel driving circuits disposed on the second substrate; the pixel driving circuits each comprise a data line, a scanning line and a capacitor metal plate; and the plurality of shading pads are arranged on a same layer as at least one of the data line, the scanning line and the capacitor metal plate.

13. An electronic device comprising a display panel, wherein the display panel comprises:
an array substrate;
a plurality of organic light emitting units disposed on the array substrate; and
at least one fingerprint identification unit located in a display region at a side, close to the array substrate, of the plurality of organic light emitting unit,
wherein the at least one fingerprint identification unit is configured to perform fingerprint identification according to light rays reflected on the at least one fingerprint identification unit by a touch body;
wherein the plurality of organic light emitting units each comprise a red organic light emitting unit, a green organic light emitting unit and a blue organic light emitting unit; wherein at least one of the red organic light emitting unit and the green organic light emitting unit emits light in a fingerprint identification phase, and serves as a light source for the fingerprint identification unit; and
wherein compared with the blue organic light emitting unit, at least one of the red organic light emitting unit and the green organic light emitting unit serving as the light source for the fingerprint identification unit has a smaller transparent area towards a side opposite to a display side of the display panel.

14. The electronic device according to claim 13, wherein the array substrate comprises a second substrate and a plurality of pixel driving circuits disposed on the second substrate, wherein the plurality of pixel driving circuits each are electrically connected with an associated one of the organic light emitting units; and
wherein the at least one fingerprint identification unit is arranged between the second substrate and the organic light emitting units.

15. The electronic device according to claim 14, compared with a vertical projection on the second substrate for the pixel driving circuit associated with the organic light emitting unit not serving as the light source for the fingerprint identification unit, a vertical projection on the second substrate for the pixel driving circuit associated with the organic light emitting unit serving as the light source for the fingerprint identification unit has a larger area; and
wherein the at least one fingerprint identification unit is arranged between the plurality of pixel driving circuits and the second substrate.

16. The electronic device according to claim 13, wherein the plurality of organic light emitting units each comprise a first electrode, a light emitting functional layer and a second electrode sequentially along a direction in which the organic light emitting units are away from the array substrate,
wherein the first electrode is a reflective electrode; and
compared with the first electrode of the blue organic light emitting unit, either one of the first electrode of the red organic light emitting unit and the green organic light emitting unit serving as the light source for the fingerprint identification unit has a larger area.

17. The electronic device according to claim 16, wherein
an area ratio of the first electrode of the organic light emitting unit serving as the light source for the fingerprint identification unit to the light emitting functional layer is in a range of 1.2 to 6, and
an area ratio of the first electrode of the organic light emitting unit not serving as the light source for the fingerprint identification unit to the light emitting functional layer is in a range of 1 to 1.2.

18. The electronic device according to claim 16, wherein, for the organic light emitting unit serving as the light source for the fingerprint identification unit, a vertical projection, on the array substrate, of a border of the first electrode of forms a first closed coil, and a vertical projection, on the array substrate, of a border of the light emitting functional layer forms a second closed coil; wherein the second closed coil is encircled by the first closed coil; wherein a shortest distance exists between any point on the first closed coil and an associated point on the second closed coil; wherein a range of the distance between the first closed coil and the second closed coil is a set of the shortest distances for all points on the first closed coil; and wherein the distance between the first closed coil and the second closed coil is in a range of 3 µm to 30 µm.

19. The electronic device according to claim 16, wherein the light emitting functional layer of the blue organic light emitting unit has a larger area than the light emitting functional layer of the red organic light emitting unit or the green organic light emitting unit.

20. The electronic device according to claim 13, wherein the array substrate further comprises a plurality of shading pads arranged between the organic light emitting units serving as the light sources of the fingerprint identification unit and the fingerprint identification unit;
wherein the plurality of organic light emitting units each comprise a first electrode, a light emitting functional layer and a second electrode sequentially along a direction in which the organic light emitting units are away from the array substrate, wherein the first electrode is a reflective electrode; and wherein compared with a vertical projection area, on the array substrate, of the first electrode of the organic light emitting unit not serving as the light source of the fingerprint identification unit, a combined vertical projection area, on the array substrate, of the first electrode of the organic light emitting configuration serving as the light source of the fingerprint identification unit and the shading pad is larger.

* * * * *